(12) United States Patent
Acosta-Serafini et al.

(10) Patent No.: US 9,099,976 B2
(45) Date of Patent: Aug. 4, 2015

(54) METHODS FOR DIGITALLY-CONTROLLED AUTOMATIC GAIN AMPLIFICATION

(71) Applicant: ANALOG DEVICES, INC., Norwood, MA (US)

(72) Inventors: Pablo Acosta-Serafini, Medford, MA (US); Kimo Tam, Lincoln, MA (US); Stuart McCracken, Arlington, MA (US); Daniel Mulcahy, Cambridge, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/047,293

(22) Filed: Oct. 7, 2013

(65) Prior Publication Data

US 2014/0037031 A1     Feb. 6, 2014

Related U.S. Application Data

(62) Division of application No. 13/196,430, filed on Aug. 2, 2011, now Pat. No. 8,558,613.

(51) Int. Cl.
*H03G 3/20* (2006.01)
*H03G 3/30* (2006.01)
*H04L 25/03* (2006.01)

(52) U.S. Cl.
CPC .............. *H03G 3/30* (2013.01); *H03G 3/3052* (2013.01); *H03G 3/3078* (2013.01); *H04L 25/03878* (2013.01)

(58) Field of Classification Search
CPC ....................................................... H03G 3/30
USPC ................... 330/133, 51, 136; 455/245.1
See application file for complete search history.

(56) References Cited

U.S. PATENT DOCUMENTS

| | | |
|---|---|---|
| 4,441,083 A | 4/1984 | Akagiri et al. |
| 5,559,464 A | 9/1996 | Orii et al. |
| 5,680,075 A | 10/1997 | Sacca |
| 5,818,278 A | 10/1998 | Yamamoto et al. |
| 5,844,431 A | 12/1998 | Chen |
| 6,275,112 B1 | 8/2001 | Muza |

(Continued)

OTHER PUBLICATIONS

Maxim Integrated Products Application Note HFAN-09.0.1, *NRZ Bandwidth—HF Cutoff vs. SNR* (2008), 5 pages (available at World Wide Web page: maxim-ic.com/app-notes/index.mvp/id/870).

(Continued)

*Primary Examiner* — Robert Pascal
*Assistant Examiner* — Khiem Nguyen
(74) *Attorney, Agent, or Firm* — Knobbe Martens Olson & Bear LLP

(57) ABSTRACT

Apparatus and methods are disclosed, such as those involving a receiver device. One such apparatus includes an equalizer configured to process an input signal transmitted over a channel. The equalizer can include a programmable gain amplifier (PGA) block which includes an input node configured to receive the input signal; an output node; and a programmable gain amplifier (PGA). The PGA amplifies the input signal with an adjustable gain. The PGA block also includes a gain control block having an input electrically coupled to the input node. The gain control block is configured to adjust the gain of the PGA at least partly in response to the input signal from the input node such that the PGA generates an output signal with a substantially constant amplitude envelope to the output node.

20 Claims, 14 Drawing Sheets

(56) References Cited

U.S. PATENT DOCUMENTS

| | | |
|---|---|---|
| 6,282,146 B1 | 8/2001 | Guo et al. |
| 6,289,044 B1 | 9/2001 | Velez et al. |
| 6,512,472 B1 | 1/2003 | Smith et al. |
| 6,608,905 B1 | 8/2003 | Muza et al. |
| 6,653,898 B2 | 11/2003 | Monroe |
| 6,728,366 B1 | 4/2004 | Barkaro |
| 6,946,876 B2 | 9/2005 | Isezaki et al. |
| 7,013,117 B2 | 3/2006 | Darabi |
| 7,068,091 B1 | 6/2006 | Kwong |
| 7,250,987 B2 | 7/2007 | Goyal et al. |
| 7,570,933 B2 | 8/2009 | Taipale et al. |
| 7,710,152 B1 | 5/2010 | El Bacha et al. |
| 7,970,364 B2 | 6/2011 | Mayer et al. |
| 8,558,613 B2 | 10/2013 | Acosta-Serafini et al. |
| 2003/0125000 A1 | 7/2003 | Gharpurey et al. |
| 2003/0146791 A1* | 8/2003 | Shvarts et al. ............... 330/297 |
| 2003/0181179 A1 | 9/2003 | Darabi |
| 2004/0090259 A1 | 5/2004 | Randazzo et al. |
| 2004/0150454 A1 | 8/2004 | Bhattacharya et al. |
| 2006/0125521 A1 | 6/2006 | Kim |
| 2006/0128334 A1 | 6/2006 | Ikuta et al. |
| 2006/0192614 A1 | 8/2006 | Behzad et al. |
| 2008/0094111 A1 | 4/2008 | Nakamori et al. |
| 2008/0204109 A1 | 8/2008 | Pilling et al. |
| 2010/0277215 A1 | 11/2010 | Tam et al. |
| 2011/0026507 A1 | 2/2011 | Katsube et al. |
| 2011/0076977 A1 | 3/2011 | Coban et al. |
| 2011/0153046 A1 | 6/2011 | Nagasue et al. |
| 2011/0317077 A1 | 12/2011 | Coban et al. |
| 2012/0058736 A1 | 3/2012 | Westra et al. |
| 2012/0237010 A1 | 9/2012 | Hurwitz |
| 2013/0034143 A1 | 2/2013 | Acosta-Serafini et al. |

OTHER PUBLICATIONS

B. Razavi, *Design of Integrated Circuits for Optical Communications* (2003,) McGraw-Hill, 1st edition, pp. 125-126.

E. Crain, *Fast Offset Compensation for a 10Gbps Limit Amplifier* (2004), Thesis for Masters of Engineering in Electrical Engineering and Computer Science at the Massachusetts Institute of Technology, 118 pages.

*High Definition Multimedia Interface Specification Version 1.4* (2009), HDMI Licensing, Inc., Chapter 5, 29 pages.

A. X. Widmer and P.A. Franaszek, *A DC-Balanced, Partitioned-Block, 8B/10B Transmission Code* (1983), IBM Journal of Research and Development, vol. 27, No. 5, pp. 440-451.

D. A. Johns and D. Essig, *Integrated Circuits for Data Transmission Over Twisted-Pair Channels* (1997), IEEE Journal of Solid-State Circuits, vol. 32, No. 3, pp. 398-406.

H. Johnson and M. Graham, *High-speed Digital Design* (1993), Prentice-Hall Inc., p. 428.

*Exotic Materials and Cable Construction*, Blue Jean Cables Article, in 3 pages (downloaded from World Wide Web page: bluejeanscable.com/articles/exoticmaterials.htm on Nov. 1, 2011).

J. Diepenbrock, *Characterization and Modeling of Cables for High-Speed Data Communications Application* (1999), 1999 Electronic Components and Technology Conference, pp. 530-534.

G. Gonzalez, *Microwave Transistor Amplifiers* (1997), second edition, Prentice-Hall Inc., p. 20.

\* cited by examiner

| LT | $A_V$ | $A_{PGA}$ | Gain setting |
|---|---|---|---|
| 0 | ∞ | 3.500 | 10 |
| 1 | 39.3410 | 3.500 | |
| 2 | 19.6705 | 3.500 | |
| 3 | 13.1137 | 3.500 | |
| 4 | 9.8353 | 3.500 | |
| 5 | 7.8682 | 3.500 | |
| 6 | 6.5568 | 3.500 | |
| 7 | 5.6201 | 3.500 | |
| 8 | 4.9176 | 3.500 | |
| 9 | 4.3712 | 3.500 | |
| 10 | 3.9341 | 3.500 | |
| 11 | 3.5765 | 3.500 | |
| 12 | 3.2784 | 3.500 | |
| 13 | 3.0262 | 3.000 | 9 |
| 14 | 2.8101 | 3.000 | |
| 15 | 2.6227 | 2.500 | 8 |
| 16 | 2.4588 | 2.500 | |
| 17 | 2.3142 | 2.500 | |
| 18 | 2.1856 | 2.000 | 7 |
| 19 | 2.0706 | 2.000 | |
| 20 | 1.9671 | 2.000 | |
| 21 | 1.8734 | 1.750 | 6 |
| 22 | 1.7882 | 1.750 | |
| 23 | 1.7105 | 1.750 | |
| 24 | 1.6392 | 1.750 | |
| 25 | 1.5736 | 1.500 | 5 |
| 26 | 1.5131 | 1.500 | |
| 27 | 1.4571 | 1.500 | |
| 28 | 1.4050 | 1.500 | |
| 29 | 1.3566 | 1.250 | 4 |
| 30 | 1.3114 | 1.250 | |
| 31 | 1.2691 | 1.250 | |
| 32 | 1.2294 | 1.250 | |
| 33 | 1.1922 | 1.250 | |
| 34 | 1.1571 | 1.250 | |
| 35 | 1.1240 | 1.000 | 3 |
| 36 | 1.0928 | 1.000 | |
| 37 | 1.0633 | 1.000 | |
| 38 | 1.0353 | 1.000 | |
| 39 | 1.0087 | 1.000 | |
| 40 | 0.9835 | 1.000 | |
| 41 | 0.9595 | 1.000 | |
| 42 | 0.9367 | 0.875 | 2 |
| 43 | 0.9149 | 0.875 | |
| 44 | 0.8941 | 0.875 | |
| 45 | 0.8742 | 0.875 | |
| 46 | 0.8552 | 0.875 | |
| 47 | 0.8370 | 0.875 | |
| 48 | 0.8196 | 0.875 | |
| 49 | 0.8029 | 0.750 | 1 |
| 50 | 0.7868 | 0.750 | |
| 51 | 0.7714 | 0.750 | |
| 52 | 0.7566 | 0.750 | |
| 53 | 0.7423 | 0.750 | |
| 54 | 0.7285 | 0.750 | |
| 55 | 0.7153 | 0.750 | |
| 56 | 0.7025 | 0.750 | |
| 57 | 0.6902 | 0.750 | |
| 58 | 0.6783 | 0.625 | 0 |
| 59 | 0.6668 | 0.625 | |
| 60 | 0.6557 | 0.625 | |
| 61 | 0.6449 | 0.625 | |
| 62 | 0.6345 | 0.625 | |
| 63 | 0.6245 | 0.625 | |

FIG. 16

METHODS FOR DIGITALLY-CONTROLLED AUTOMATIC GAIN AMPLIFICATION

CROSS-REFERENCE TO RELATED APPLICATIONS

This application is a divisional of U.S. application Ser. No. 13/196,430, filed Aug. 2, 2011, entitled "APPARATUS AND METHOD FOR DIGITALLY-CONTROLLED AUTOMATIC GAIN AMPLIFICATION", the entire disclosure of which is hereby incorporated herein by reference.

This application is related to U.S. application Ser. No. 13/196,332, titled APPARATUS AND METHOD FOR DIGITALLY-CONTROLLED ADAPTIVE EQUALIZER, filed on Aug. 2, 2011, the disclosure of which is hereby incorporated by reference in its entirety herein. This application is also related to U.S. application Ser. No. 12/503,372, titled WIDEBAND VOLTAGE TRANSLATORS, filed on Jul. 15, 2009, now U.S. Pat. No. 8,106,700, issued Jan. 31, 2012, the disclosure of which is hereby incorporated by reference in its entirety herein.

BACKGROUND

1. Field

Embodiments of the invention relate to electronic devices, and more particularly, in one or more embodiments, to data transmission for electronic devices.

2. Description of the Related Technology

Many electronic systems transmit data over a channel between devices. Referring to FIG. 1A, a conventional electronic communication system for transmitting a signal via a channel will be described below. The illustrated system 100 includes a transmitter device 110, a receiver device 120, and a channel 130.

The transmitter device 110 transmits data and/or control signals to the receiver device 120 via the channel 130. Examples of the transmitter device 110 include, but are not limited to, a video data source, an audio data source, or an audiovisual data source. For example, the audiovisual data source can be a DVD player.

The receiver device 120 receives data and/or control signals from the transmitter device 110 via the channel 130. Examples of the receiver device 120 include, but are not limited to, a display device, such as a television or monitor. The receiver device 120 can include a receiver 125 to receive and process data and/or control signals from the transmitter device 110.

The channel 130 can include one or more media, such as, but not limited to, copper twisted pair channels, printed circuit board traces, or optical fiber. In another example, at least part of the channel 130 can be wireless. In other examples, the system 100 can also include a "back-channel" between the transmitter device 110 and the receiver device 120. The back-channel can be used for exchanging, for example, control information. For example, the back-channel can be used to set pre-emphasis (transmit equalization) in the transmitter device 110. The transmitter device 110 can send a test pattern to the receiver device 120 so that the receiver device 120 can adapt the equalization gain of the receiver 125. If the equalization is at its maximum and there still exist bit errors above an acceptable rate, the receiver device 120 can inform the transmitter device 110 of this fact so that the transmitter device 110 can start pre-emphasizing its output in steps, and at each step the receiver device 120 can inform the transmitter device 110 of a bit error rate.

Referring to FIG. 1B, one example of the receiver 125 of FIG. 1A will be described below. The receiver 125 can be, for example, a High-Definition Multimedia Interface (HDMI) receiver. The illustrated receiver 125 is a 4-input receiver that includes first to fourth equalizers 130a-130d, first to fourth samplers 140a-140d, a multiplexer 150, and a processor 160. In other examples, the number of inputs of a receiver can vary widely (for example, 1 to 5 inputs).

Each of the equalizers 130a-130d receives three signals via the channel 130 (FIG. 1A) at inputs RXA_0 to RXA_2, RXB_0 to RXB_2, RXC_0 to RXC_2, RXD_0 to RXD_2, and processes the signals. Each of the samplers 140a-140c receives processed data signals from a respective one of the equalizers 130a-130d, and samples the signals. The multiplexer 150 receives the sampled signals from the samplers 140a-140d, and selectively or alternately provides the sampled signals to the processor 160. The processor 160 can process the sampled signals for, for example, playback at the receiver device 120 (FIG. 1A).

In one example, the electronic system 100 of FIG. 1A can form a serial digital link system in which the transmitter device 110 sends one or more streams of bits or digits encoded in suitable symbols to the receiver device 120 through the channel 130. In such an example, it is desirable that the serial link can transmit symbols at a given rate with low error probability.

SUMMARY

In one embodiment, an apparatus includes: an input node configured to receive an input signal; an output node; a programmable gain amplifier (PGA) having an input electrically coupled to the input node, and an output electrically coupled to the output node, the PGA being configured to amplify the input signal with an adjustable gain; and a gain control block having an input electrically coupled to the input node. The gain control block is configured to adjust the gain of the PGA based at least partly on an observed amplitude envelope of the input signal from the input node such that the PGA generates an output signal with a substantially constant amplitude envelope to the output node.

In another embodiment, an apparatus includes: an input node configured to receive an input signal; an output node; and a programmable gain amplifier (PGA) having an input electrically coupled to the input node, and an output electrically coupled to the output node. The PGA is configured to amplify the input signal with an adjustable gain. The PGA includes a coarse gain adjustment stage and a fine gain adjustment stage coupled in series between the input node and the output node. The coarse gain adjustment stage is configured to adjust the gain of the PGA more roughly than the fine gain adjustment stage. Each of the coarse gain adjustment stage and the fine gain adjustment stage comprises two or more transconductance units, each of the transconductance units being electrically coupled in parallel to one another. The PGA is configured to select at least one of the transconductance units of two or more of the coarse gain adjustment stage or the fine gain adjustment stage to provide at least part of the gain of the PGA.

In yet another embodiment, a method includes: receiving an input signal at an input of a receiver over a channel; obtaining information on an amplitude envelope of the input signal for a selected period of time; adjusting a gain of a programmable gain amplifier (PGA), based at least partly on the information; and amplifying the input signal using the PGA with the adjusted gain.

BRIEF DESCRIPTION OF THE DRAWINGS

FIG. 16 illustrates one example of a look-up table.

DETAILED DESCRIPTION OF EMBODIMENTS

Figure 1A:
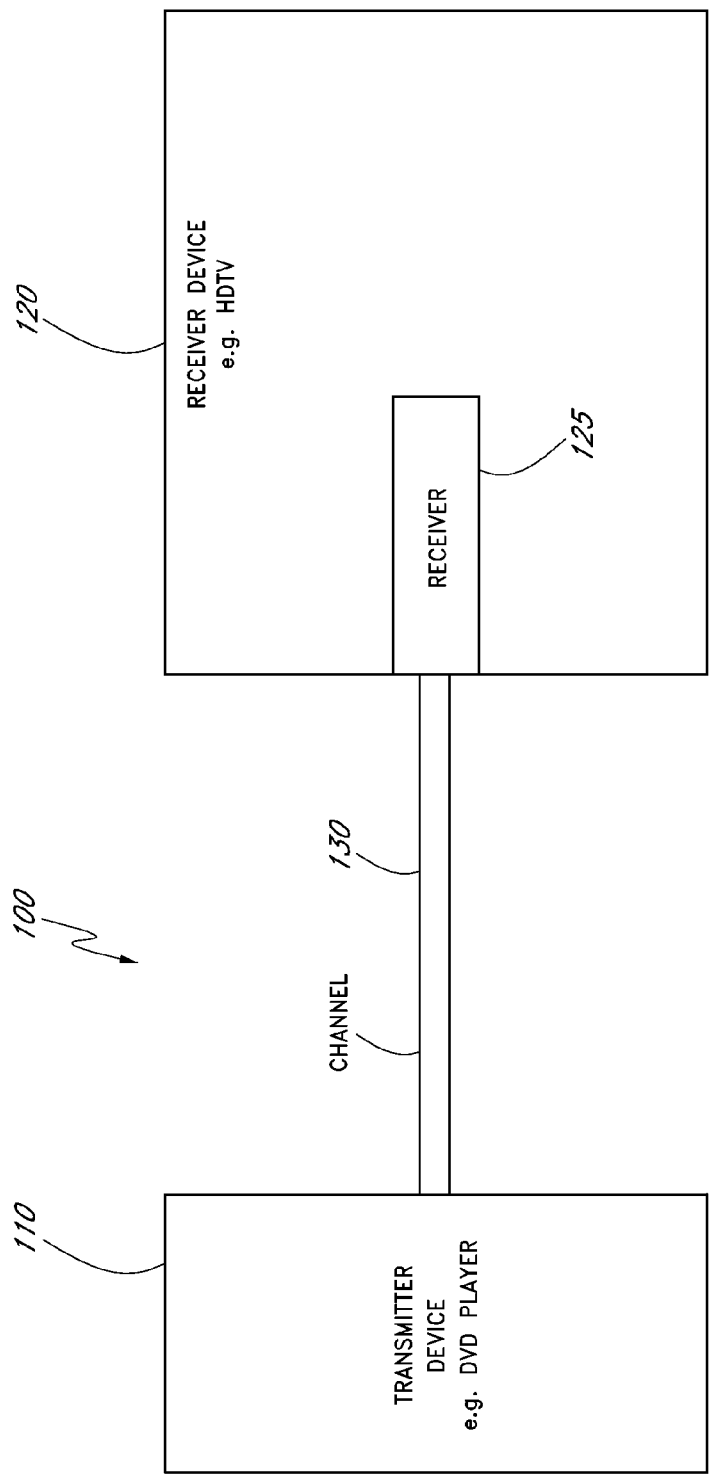
FIG. 1A is a schematic block diagram illustrating a conventional electronic system including a transmitter device and a receiver device.

The following detailed description of certain embodiments presents various descriptions of specific embodiments of the invention. However, the invention can be embodied in a multitude of different ways as defined and covered by the claims. In this description, reference is made to the drawings in which like reference numerals indicate identical or functionally similar elements.

Overview of Serial Data Transmission

Figure 2:
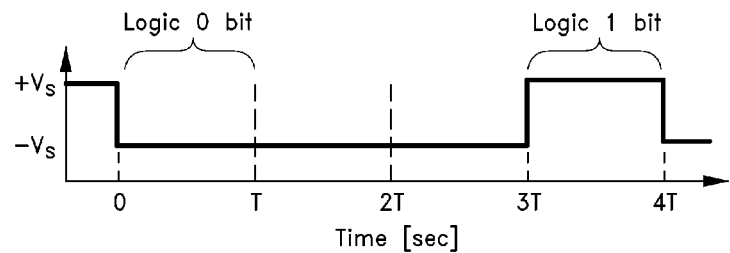
FIG. 2 is a timing diagram of an example of bit encoding for a serial digital data link.

FIG. 2 shows one example of a sequence that can be transmitted in the system 100 of FIG. 1A. In one example, the transmitter device 110 (FIG. 1A) can encode a single bit at a time, and send a positive voltage +Vs when the bit is a logic one (or high), or a negative voltage −Vs when the bit is a logic zero (or low). In this case, the symbol rate of the sequence is identical to the bit rate, and the minimum inter-symbol distance is 2·Vs. The term "bit rate" refers to the number of data bits transmitted per second in original form before symbol-encoding. The term "symbol rate" refers to the number of symbols transmitted per second. For example, in High-Definition Multimedia Interface (HDMI), Serial Advanced Technology Attachment (SATA), or the like, the bit rate and the symbol rate are the same as each other. In other words, the encoding is 1 bit per symbol. However, in other instances, the bit rate can be different from the symbol rate. For example, assume that a first system has two voltage levels, +Vs and −Vs and its symbol rate is 1 Gigabits (Gb)/sec, and that a second system has a symbol rate of 1 Gb/sec, but has 4 voltage levels (for example, +2Vs, +1Vs, −1Vs, −2Vs). The second system has a symbol rate the same as the first system, but the bit rate of the second system is twice the bit rate of the first system. The term "inter-symbol distance" refers to a difference between voltage levels representing different symbols.

The symbol rate can also be referred to as a data rate (DR), and can be constant. It can be desirable that each bit lasts the same duration or period of time, T=1/DR. Such symbol encoding is used in various serial link standard specifications, such as HDMI, SATA, or Peripheral Component Interconnect (PCI) Express.

Figure 3:
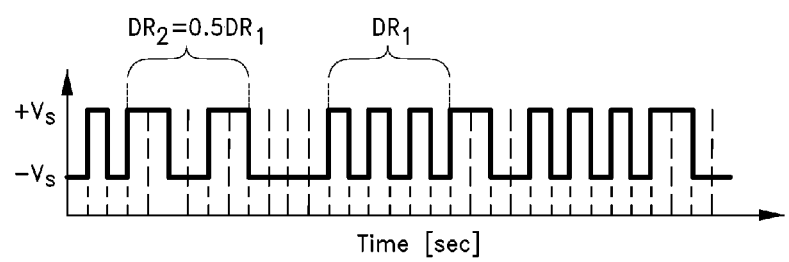
FIG. 3 is a timing diagram of the bit encoding of FIG. 2 on different transmitted data words, and illustrates how the effective data rate can change based on the transmitted data words.

With serial transmission of symbols, the effective data rate can also change temporally, depending on which symbols are being transmitted. This can make the spectral content of a symbol stream broad and time-dependent. FIG. 3 shows an example of a symbol sequence that can be encountered in a system using the HDMI standard.

Symbol rate and/or error probability can be adversely affected by parts of a communication system, for example, the transmitter device 110, the receiver device 120, and the channel 130 of the system 100. Transmitter devices can suffer from two main non-idealities: symbol period variability (which can also be referred to as jitter) and minimum inter-symbol distance variability.

Figures 4A, 4B:
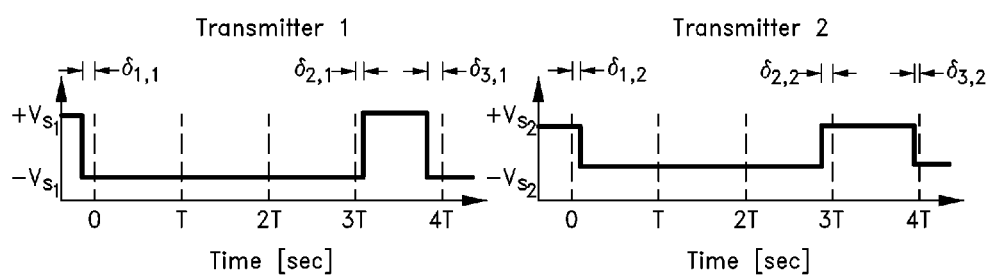
FIGS. 4A and 4B are timing diagrams illustrating examples of jitter and minimum inter-symbol distance variability.

Symbol period variability can occur because each symbol period can be slightly longer or shorter than the reference (constant) symbol period. The sources of these differences can be deterministic (inter-symbol interference, duty cycle distortion, or the like) or random (noise or the like). FIGS. 4A and 4B illustrate two different examples of jitter and minimum inter-symbol variability. FIG. 4A shows symbol period variability $\delta_{1,1}, \delta_{2,1}, \delta_{3,1}$, and FIG. 4B shows symbol period variability $\delta_{1,2}, \delta_{2,2}, \delta_{3,2}$, relative to the duration T of the sequence of FIG. 2. Symbol period variability can degrade symbol detection as a relatively good symbol sampling point can be difficult to determine and/or fluctuate temporally.

The source of variability can be deterministic (by design, systematic offsets, or the like) or random (resistivity variation, fabrication lot-to-lot variation, or the like). In the illustrated example, the inter-symbol variability of the Transmitter 1 of FIG. 4A is greater than the inter-symbol variability of the Transmitter 2 of FIG. 4B.

Figure 5:
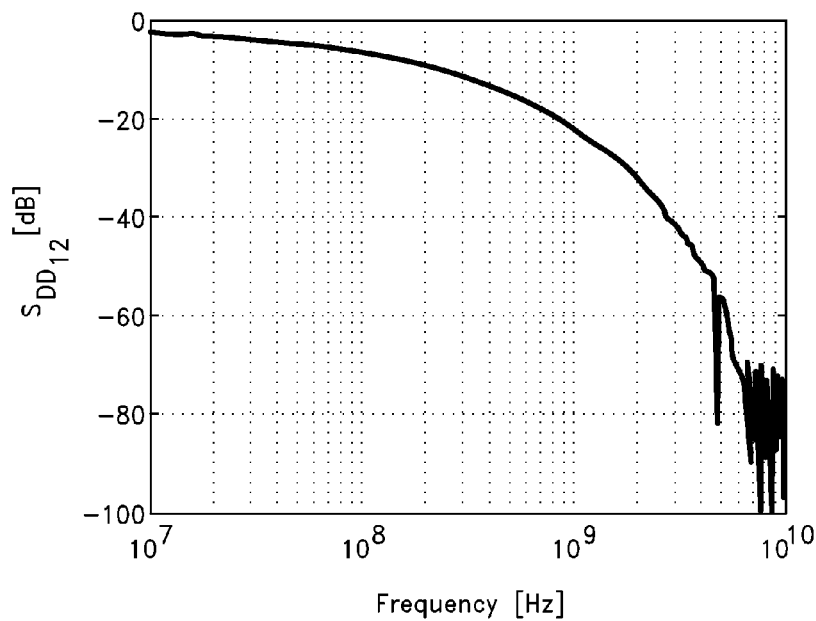
FIG. 5 is a graph illustrating the input/output transfer function of an example HDMI channel.

A transmission channel, such as the channel 130 of FIG. 1A, can affect a bit stream in a variety of ways which can make received symbols an altered representation of transmitted symbols. A channel can have frequency-dependent attenuation, introduce noise, introduce crosstalk between adjacent channels, or the like, any of which can distort the transmitted symbols and make the decoding of the received symbols more difficult. Several channel types are low-pass by nature in that their minimum inter-symbol difference attenuation at high frequencies is higher (sometimes substantially higher) than their attenuation at low frequencies. FIG. 5 illustrates an example of the input/output transfer function of a 30-meter 24 American Wire Gage (AWG) HDMI cable, which has low-pass characteristics.

Figure 6A:
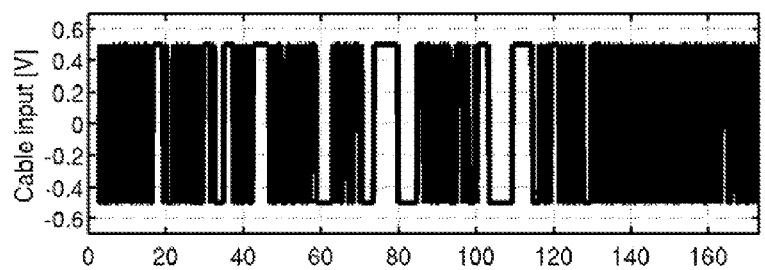
FIG. 6A is a timing diagram of a serial bit stream at a channel input of the example HDMI channel.
Figure 6B:
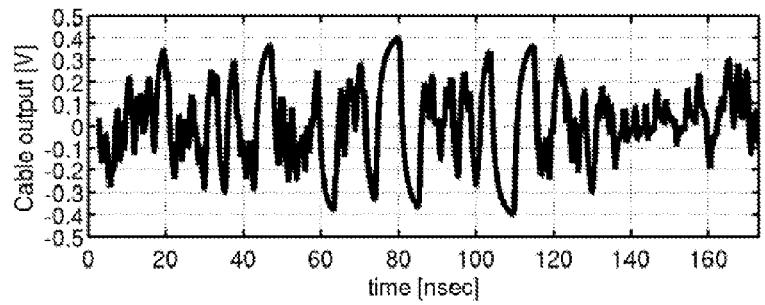
FIG. 6B is a timing diagram of the serial bit stream of FIG. 6A at a channel output of the example HDMI channel.

The channel's low-pass characteristic in conjunction with the broad frequency spectrum of the transmit symbol stream can result in relatively large variations in the received symbol stream signal. This can result into a signal that has a time-varying instantaneous power spectrum. FIG. 6 shows a section of a received HDMI bit stream at the output of a 30-meter 24AWG HDMI cable where the amplitude difference between high data rate sections to low data rate sections can be higher than 4:1.

Receivers for Compensation for Non-Idealities

Figure 1B:
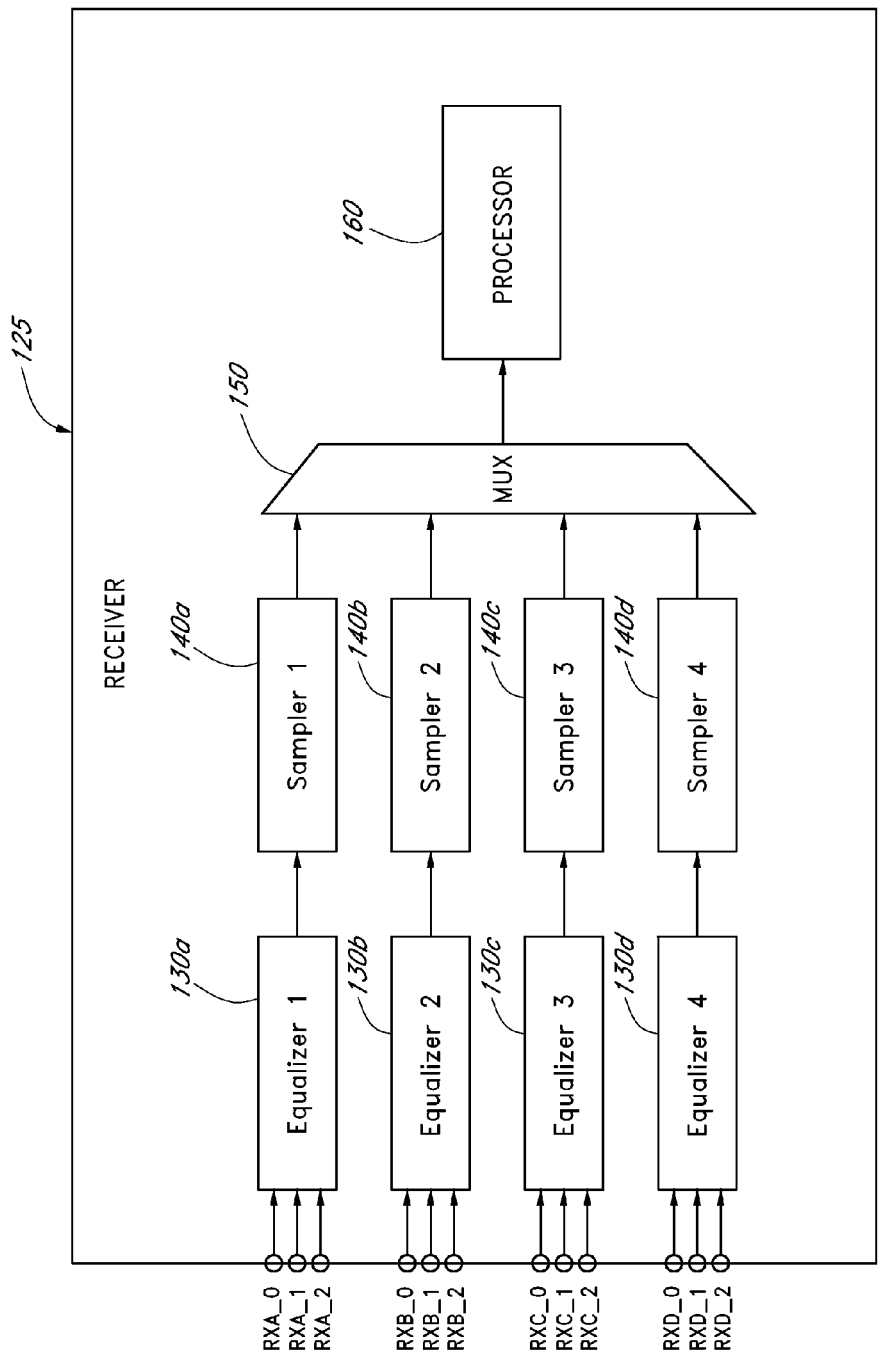
FIG. 1B is a schematic block diagram illustrating a schematic block diagram illustrating a conventional receiver.
Figure 7:
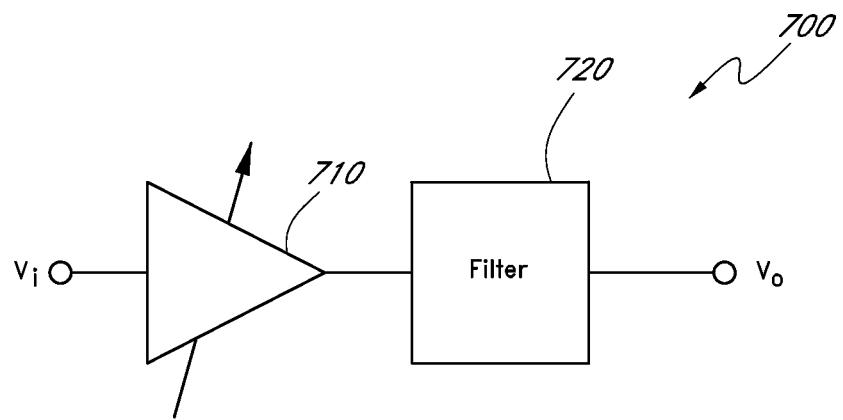
FIG. 7 is a schematic block diagram of a conventional equalizer in a receiver.

A receiver device in a data communication system can be configured to compensate for selected non-idealities. Referring to FIG. 7, in a serial link system, such as that shown in FIG. 1A, an equalizer 700 can include a programmable-gain amplifier (PGA) 710 for compensation for non-idealities in a transmitter device of the system, and/or a filter 720 for compensation for non-idealities in a channel of the system. Referring back to FIG. 1B, each of the equalizers 130a-130d can include a PGA and/or a filter for each of serial data links coupled to the inputs RXA_0 to RXA_2, RXB_0 to RXB_2, RXC_0 to RXC_2, RXD_0 to RXD_2.

In certain instances, a filter that approximates the inverse of the input/output transfer function of the channel can be used in the receiver to cancel the effects of the channel which has low-pass characteristics. Such a filter typically uses a constant minimum inter-symbol distance, which can be achieved by placing a PGA between the channel and the filter. The gain of the PGA needs to be adjusted, depending on the target filter input signal requirements as well as deviations of the transmitter minimum inter-symbol distance from nominal values and the channel being used. In many systems, neither the transmitter minimum inter-symbol distance nor the characteristics of the channel being used are known, and thus, selection of the proper amount of gain can be difficult to determine.

Digitally Controlled Programmable Gain Amplifier

Receivers, such as an HDMI receiver, can experience amplitude envelope variation at their inputs. The term "amplitude envelope" refers to how the maximum amplitude of a waveform evolves over time. A received HDMI signal can have a relatively large amount of amplitude envelope variation due to two main reasons: a) cable attenuation and b) transmitter amplitude variation. Cables have a low-pass filter response and a non-negligible loss at relatively low frequencies, such as below 10 MHz. The amount of attenuation can vary based on cable length. The HDMI standard allows for transmitter amplitude in the [800 mVpp, 1.4 Vpp] range.

Applicants found that a filter in a receiver can exhibit improved performance when its input has a relatively fixed/constant amplitude envelope. A PGA in the receiver, upstream of an equalizing high-pass filter, can provide the input to the filter to have a relatively constant amplitude envelope. The PGA and associated circuits can sense the magnitude of the input amplitude envelope and adaptively adjust its gain accordingly to meet a desired (and programmable) filter input amplitude envelope.

In one embodiment, a digitally-controlled PGA can be adapted for a serial digital link system in which a relatively fixed output amplitude should be presented to a channel-equalizing filter when the input received has a wide amplitude range. In addition, a technique for automatically selecting the PGA gain is disclosed (hence creating an automatic gain-controlled amplifier or AGC) and without a priori knowledge of the channel or of the transmitter characteristics, such that a relatively good PGA gain can be selected by observing an input signal with a time-dependent instantaneous power.

A programmable gain amplifier (PGA) according to one embodiment can have a broad gain range by having a split-path architecture, and can be controlled digitally via a window-comparator and an adaptation technique. The PGA can be digitally controlled through the use of transconductance unit cells. Several digital gain codes associated with PGA gain transfer characteristics can be provided, depending on how many transconductance unit cells are to be used in an increment of the gain code. The PGA can also have split paths for separately handling a gain greater than 1 and a gain smaller than 1 with linearity and speed. The PGA can generate a constant current through a transconductance unit cell and bias design. The use of the window comparator and adaptation method can produce a relatively constant PGA amplitude. The adaptation technique can take advantage of the monotonicity of PGA transfer characteristic and the discrete nature of the PGA gain to efficiently provide adaptation.

Figure 8:
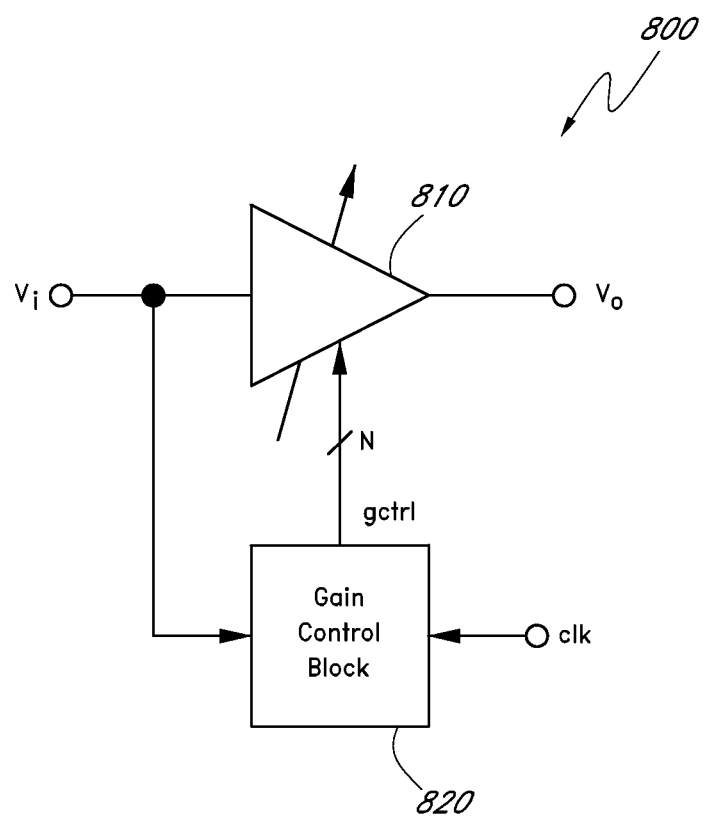
FIG. 8 is a schematic block diagram of an automatic gain amplifier including a programmable gain amplifier block and a gain control block according to one embodiment.

Referring to FIG. 8, a programmable gain amplifier block according to one embodiment will be described below. The illustrated programmable gain amplifier block 800 can be part of an equalizer in a receiver (for example, any of the equalizers 130a-130d of FIG. 1B), and can include a programmable gain amplifier (PGA) 810 and a gain control block 820. The PGA 810 receives an input voltage signal Vi and amplifies it to generate an output voltage signal Vo. The output voltage signal Vo can be provided to a high pass filter of the equalizer.

The gain control block 820 can also receive the input voltage signal Vi and provide a gain control signal gctrl to the PGA 810. In the illustrated embodiment, the gain control block 820 can be a digital circuit that observes the input voltage signal Vi, and selects the gain of the PGA 810 in response to the input voltage signal Vi. For example, the selected gain can be one that makes the amplitude envelope of the output voltage signal Vo as close as possible to a reference amplitude envelope. In adjusting the gain of the PGA 810, the illustrated gain control block 820 changes the gain in discrete increments. The gain control block 820 can use a digital clock clk whose frequency can be substantially lower than the symbol or bit rate of the input voltage signal Vi.

In the illustrated embodiment, the gain control block 820 can be used for the gain adaptation of the programmable gain amplifier (PGA) 810 (FIG. 8). In such an embodiment, the input signal Vi, which is also provided to the input of the PGA 810, can be differential and referenced to the positive power supply, which can be referred as common mode logic (CIVIL).

Figure 9:
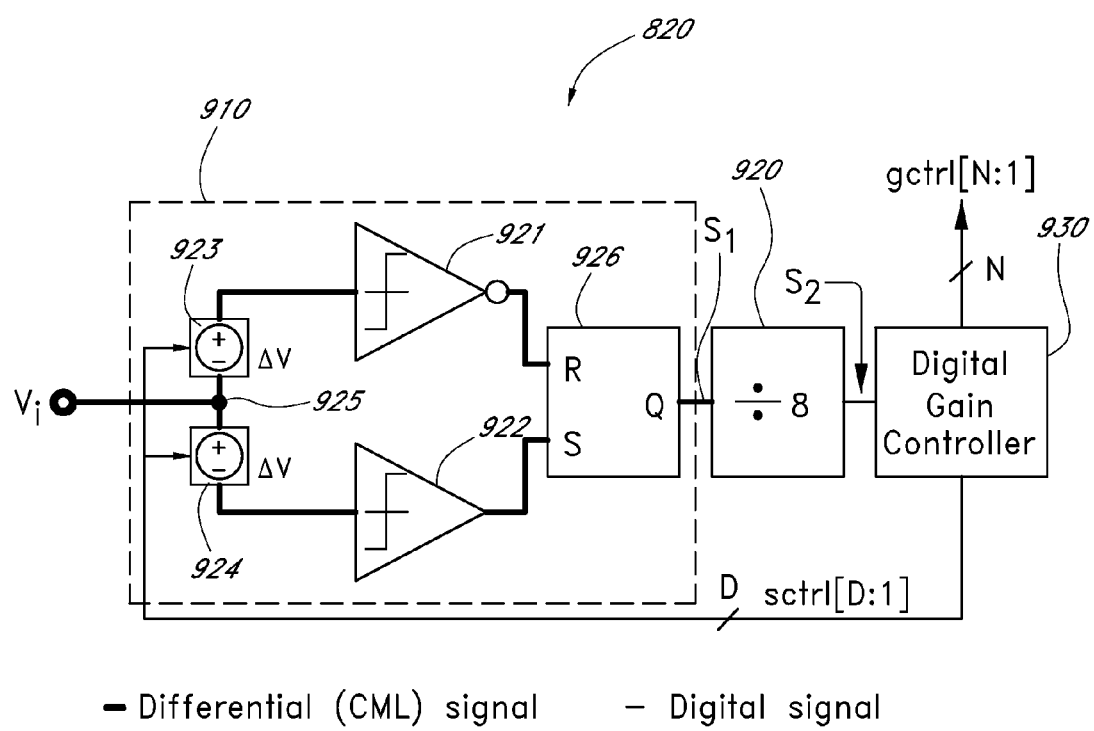
FIG. 9 is a schematic block diagram of a gain control block including a window comparator, a frequency divider, and a digital gain controller according to one embodiment.

Referring to FIG. 9, a gain control block according to one embodiment will be described below. The illustrated gain control block includes a window comparator 910, a frequency divider 920, and a digital gain controller 930. In the illustrated embodiment, the window comparator 910 can include a first comparator 921, a second comparator 922, a first variable voltage level shifter 923, a second variable voltage level shifter 924, an input node 925, and a set-reset (S-R) latch 926. In the illustrated embodiment, the input signal is a differential CIVIL signal. Only the non-inverting portion of the circuit is illustrated in FIG. 9. For clarify, the inverting portion has been left out. In addition, in an alternative embodiment, when the input signal can be assumed to be symmetric around a common mode point, the window comparator 910 can take advantage of the symmetry and detect a window with only one comparator and one reference voltage.

The window comparator 910 can compare the amplitude envelope of the input voltage signal Vi to a programmable reference voltage threshold, ±ΔV (the reference voltage is controlled by a digital control signal sctrl[D:1]). In the second comparator 922, the input voltage signal Vi is level-shifted by −ΔV, and then compared to zero (referred to as "sliced"). Therefore, when the input voltage signal Vi of the PGA block 800 (FIG. 8) is above +ΔV, the binary output of the second comparator 922 is a logic high. When the input voltage signal Vi of the PGA block 800 is below +ΔV, the binary output of the second comparator 922 is a logic low.

Note that the first comparator 921 has an inverted output as indicated by the bubble on the output in FIG. 9. In the first comparator 921, the input is shifted by +ΔV and then compared to zero. Therefore, when the input (input voltage signal Vi) of the PGA block 800 is below −ΔV, the inverted (complementary) binary output of the first comparator 921 is a logic high. When the input of the PGA block 800 is above −ΔV, the inverted binary output of the first comparator 921 is a logic low.

The output of the window comparator 910 is produced by the set-reset (S-R) latch 926. The set input (S) of the latch 926 is coupled to the output of the second comparator 922 while the reset input (R) of the latch 926 is coupled to the inverted output of the first comparator 921. The following truth table (Table 1) describes the operation of the S-R latch 926 with respect to the input signal Vi and windowed comparisons.

TABLE 1

| Vi | S | R | S1 |
|---|---|---|---|
| below +ΔV; above −ΔV | 0 | 0 | No change from previous state |
| below −ΔV | 0 | 1 | 0 |
| above +ΔV | 1 | 0 | 1 |

Figure 10:
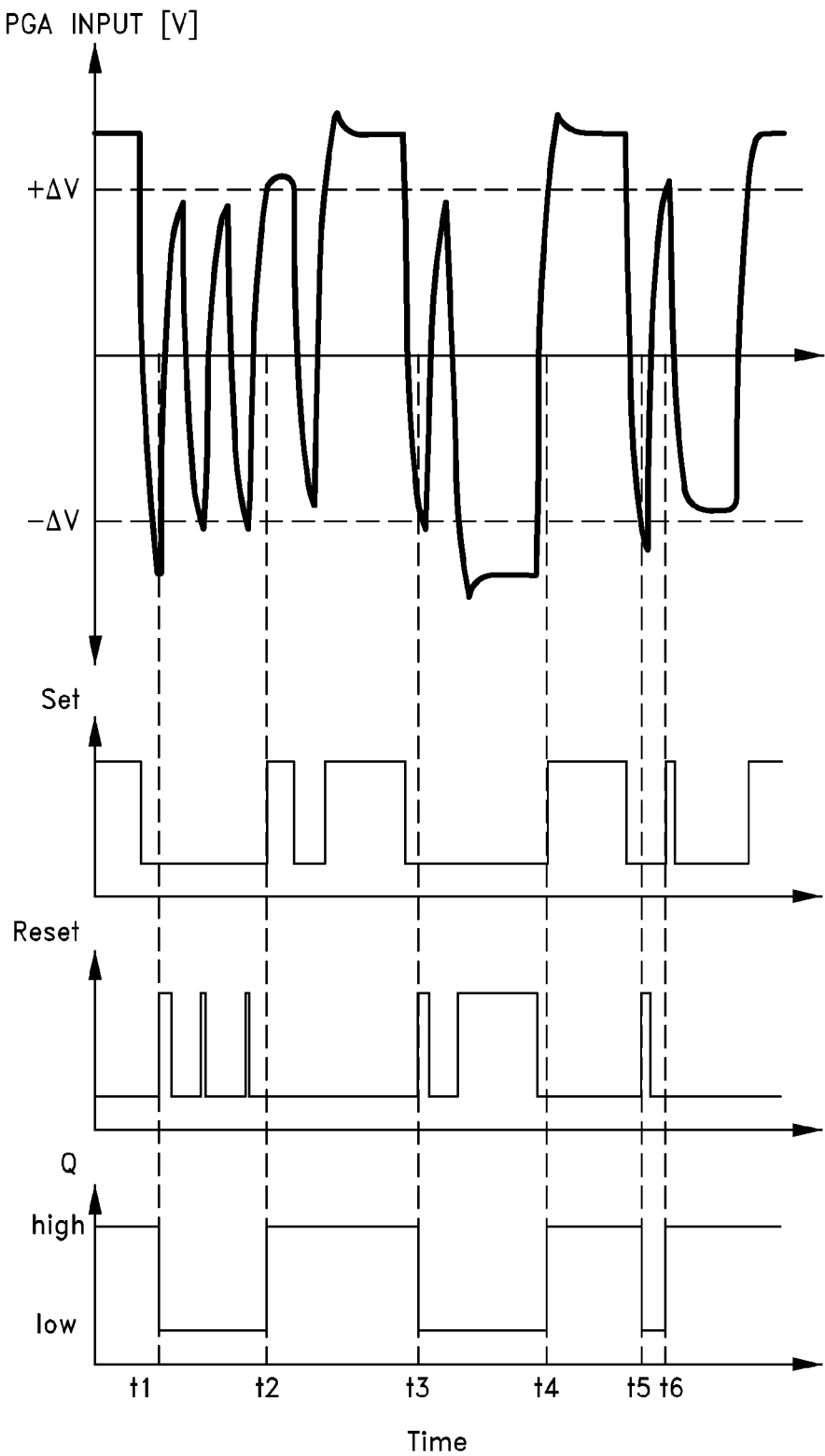
FIG. 10 shows timing diagrams illustrating example signals that can be observed at various portions of the window comparator of FIG. 9.

FIG. 10 is an example of a timing diagram of a PGA input signal, set input, reset input, and output Q of the latch 926. As illustrated by the above truth table, the output S1 of the window comparator remains at its previous state when the input voltage is within the window of −ΔV and +ΔV. Above this window, the output S1 is a logic high, and below this window, the output S1 is a logic low.

The set-reset (S-R) latch 926, which may also be referred to as an S-R flip-flop, can have a reset input R coupled to the inverting output of the first comparator 921, a set input S coupled to the output of the second comparator 922, and an output Q coupled to an input of the frequency divider 920. In an alternative embodiment, a J-K latch is used instead.

The frequency divider 920 serves to receive a window comparator output signal S1 from the window comparator 910, and to divide the frequency of the signal S1. The frequency divider 920 can be a divide-by-N block, in which N is a number equal to or greater than 2. In the illustrated embodiment, N is 8, but N can be other values, including other integer or non-integer. The frequency divider 920 thus generates a lower speed signal, which is referred to as a divider output signal S2 in the context of this embodiment. The frequency divider 920 lowers the maximum frequency of the window comparator output signal S1 (by a factor of, for example, 8) so that it can be reliably used by the digital gain controller 930 and to ease implementation when the standard cells cannot operate at the data rate. In other embodiments, if the maximum clock rate of the digital cells implementing the digital gain controller 930 is equal to or higher than half of the data rate of the input voltage signal Vi, the frequency divider 920 can be omitted.

The digital gain controller 930 serves to receive the divider output signal S2 and perform a process to generate a gain control signal gctrl which can include N bits. N is an integer equal to or greater than 1. In one embodiment, the PGA 810 (FIG. 8) can have two gain settings, and in that case, N is 1. In one embodiment, an appropriate value for the gain control signal gctrl is retrieved from a lookup table 1254 (FIG. 12A) as will be described in greater detail later in connection with the state 1580 and the method illustrated in FIG. 15. The process can be implemented by hardware or by a combination of hardware and firmware/software. The hardware can utilize, for example, standard cells.

Figure 11A:
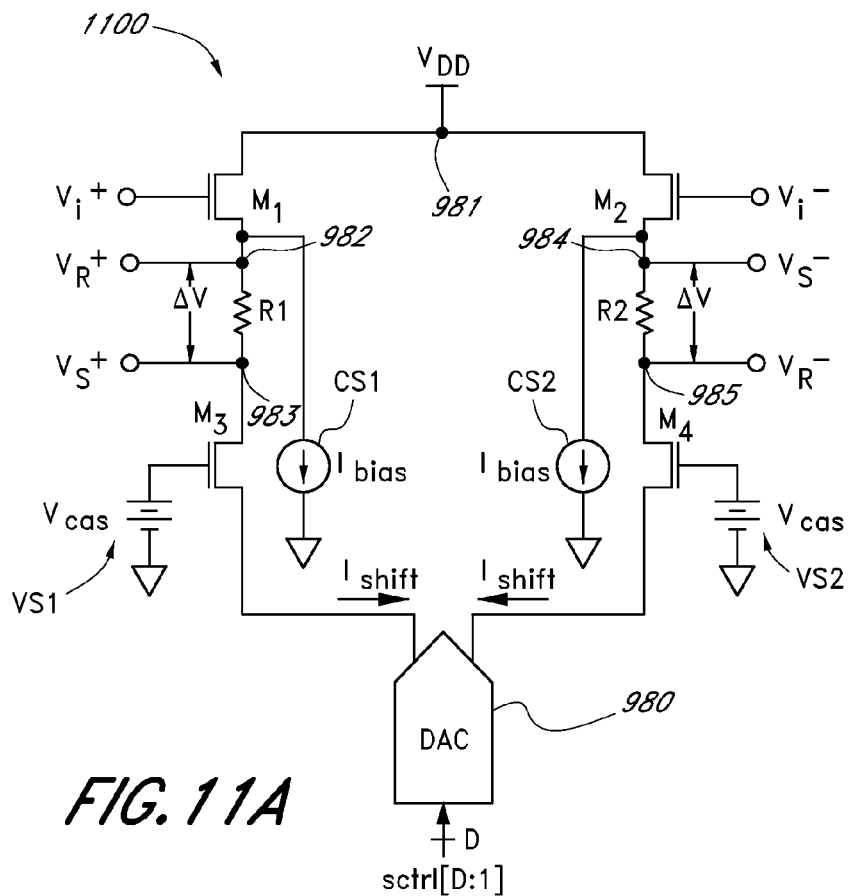
FIG. 11A is a schematic circuit diagram of a differential level shifter that is part of a window comparator of a gain control block according to one embodiment.

In one embodiment, the window comparator 910 can include a differential voltage shifter. FIG. 11A shows one embodiment of a differential voltage shifter 1100, which can be used for the level shifters 923, 924 (FIG. 9). The illustrated differential voltage shifter 1100 includes a first transistor M1, a second transistor M2, a third transistor M3, a fourth transistor M4, a first resistor R1, a second resistor R2, a first bias current source CS1, a second bias current source CS2, a first voltage source VS1, a second voltage source VS2, a current-output digital-to-analog converter (DAC) 980, and first to fifth nodes 981-985.

The first transistor M1 can be an NMOS transistor having a drain coupled to the first node 981, a source coupled to the second node 982, and a gate to receive a first component $Vi^+$ of a differential input signal Vi. The second transistor M2 can be an NMOS transistor having a drain coupled to the first node 981, a source coupled to the fourth node 984, and a gate to receive a second component $Vi^-$ of the differential input signal Vi.

The third transistor M3 can be an NMOS transistor having a drain coupled to the third node 983, a source coupled to a first output of the DAC 980, and a gate coupled to an anode of the first voltage source VS1. The cathode of the first voltage source VS1 is coupled to a voltage reference, such as ground. The fourth transistor M4 can be an NMOS transistor having a drain coupled to the fifth node 985, a source coupled to a second output of the DAC 980, and a gate coupled to an anode of the second voltage source VS2. The cathode of the second voltage source VS2 is coupled to a voltage reference, such as ground. In other embodiments, each of the transistors M1-M4 can be either a PMOS or NMOS transistor. In alternative embodiments, one or more of the transistors M1-M4 can be a bipolar junction transistor.

The first resistor R1 has a first end coupled to the second node 982, and a second end coupled to the third node 983. The second resistor R2 has a first end coupled to the fourth node 984, and a second end coupled to the fifth node 985. Each of the first and second resistors R1, R2 can have a resistance R.

The first node 981 is coupled to a first voltage reference $V_{DD}$. The second node 982 is coupled to a first component $V_R^+$ of the reset input of the latch 926 (FIG. 9), and is also coupled to the first bias current source CS1. The third node 983 is coupled to a first component $V_S^+$ of the set input of the latch 926 (FIG. 9). The fourth node 984 is coupled to a second component $V_S^-$ of the set input of the latch 926 (FIG. 9), and is also coupled to the second bias current source CS2. The fifth node 985 is coupled to a second component $V_R^-$ of the reset input of the latch 926 (FIG. 9).

During operation, $V_R^+$ is shifted from $Vi^+$ by the gate-source voltage $V_{GS}$ of the first transistor $M_1$. Then, $V_R^+ = \Delta V + V_S^+$ when $\Delta V = I_{SHIFT} \cdot R1$. The second node 982 is level shifted from the third node 983, and the fourth node 984 is level shifted from the fifth node 985.

The first and second transistors M1, M2 form a differential source follower/level shifter, which can buffer and isolate the input signal Vi from the output. Bias currents $I_{bias}$ can bias the first and second transistors M1, M2 for a selected speed. The current output DAC 980 can generate two equal copies of a current $I_{shift}$, which can create two equal voltage drops across resistors R1, R2. The voltage drops can be $\Delta V = R \cdot I_{shift}$. Therefore, assuming that a voltage shift $\Delta V_{SF}$ between input and output of the source followers is constant, the outputs of the window comparator 910 (FIG. 9) can have relationships as expressed in Equations (1) and (2) below.

$$V_S^+ - V_S^- = (V_i^+ - \Delta V_{SF}) - (V_i^- - \Delta V_{SF} - R \cdot I_{shift}) = V_i^+ - V_i^- + \Delta V \qquad \text{Equation (1)}$$

$$V_S^+ - V_S^- = (V_i^+ - \Delta V_{SF} - R \cdot I_{shift}) - (V_i^- - \Delta V_{SF}) = V_i^+ - V_i^- - \Delta V \qquad \text{Equation (2)}$$

Figure 11B:
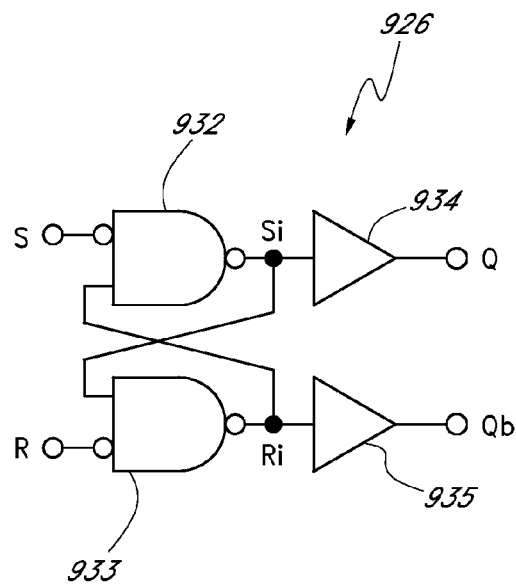
FIG. 11B is a schematic circuit diagram of a set-reset latch of the gain control block according to one embodiment.

In one embodiment, the S-R latch 926 can have a conventional NAND-gate configuration, as shown in FIG. 11B, which includes a first NAND gate 932, a second NAND gate 933, a first buffer 934, and a second buffer 935. The hold time of the S-R latch 926 (minimum input pulse width of either S or R) is twice the propagation delay of the NAND gates 932, 933. This can allow the logic state of the feedback path to match the logic state of input that has been asserted (logic high), thus allowing this input to be deasserted (logic low) without the latch losing its stable state. For example, one stable state of the latch 926 is when Q, Si, S and R are deasserted and Qb and Ri are asserted. When S is asserted, Si is asserted one NAND propagation delay after this event, but Ri is still asserted. Therefore, in that state, Si should be asserted only about as long as S is asserted, too. That is a transitory state in which Si and Ri are not the logical complements of each other. Ri changes the logic state and becomes deasserted one NAND propagation delay after Si is asserted, or two propagation delays after S was originally asserted. After Ri is deasserted, Si logic state becomes independent of the logic state of S.

Figure 12A:
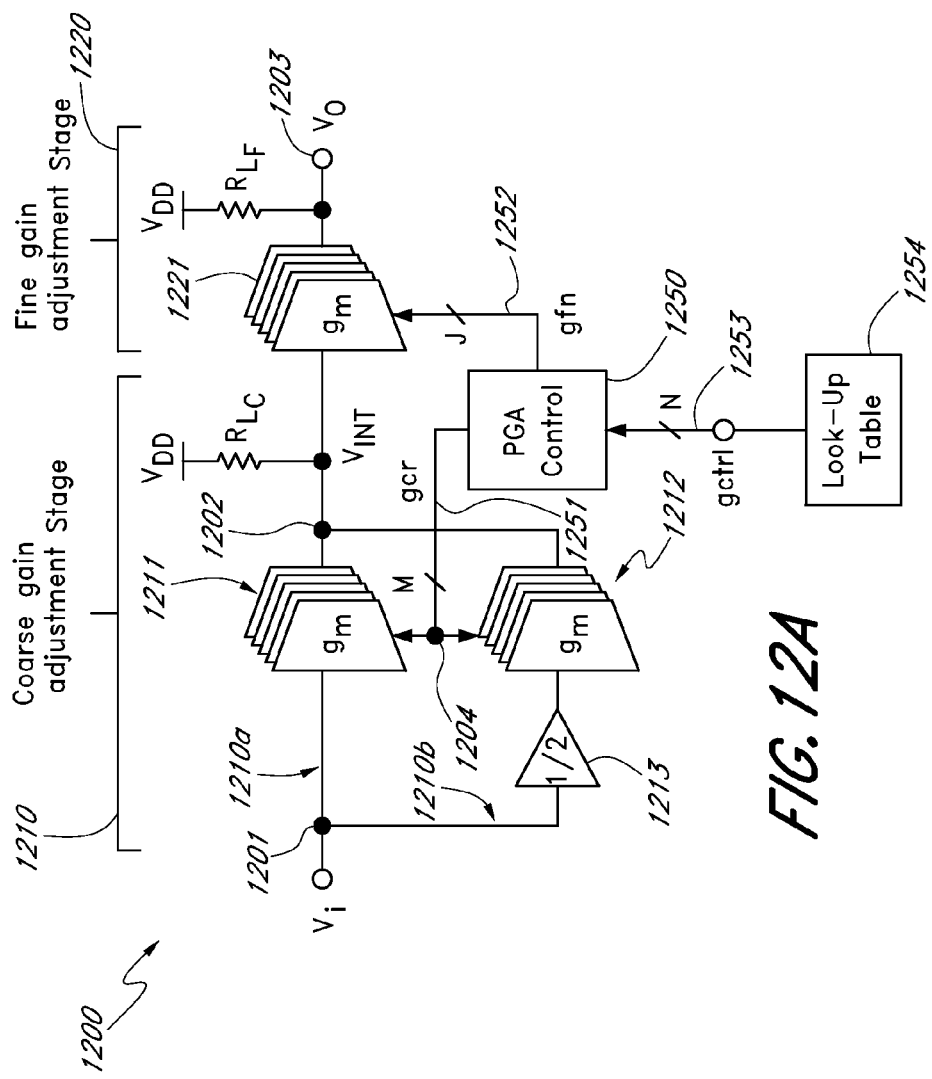
FIG. 12A is a schematic block diagram of a programmable gain amplifier block according to one embodiment.

Referring to FIG. 12A, a programmable gain amplifier (PGA) according to one embodiment will now be described. The illustrated PGA 1200 can be used for the PGA 810 of FIG. 8. The PGA 1200 can include a coarse gain adjustment stage 1210 and a fine gain adjustment stage 1220 cascaded with each other.

The coarse gain adjustment stage 1210 serves to receive an input voltage signal Vi and amplifies it with a first gain to provide an intermediate voltage signal $V_{INT}$. The fine gain adjustment stage 1220 serves to further amplify the intermediate voltage signal $V_{INT}$ with a second gain. The coarse gain adjustment stage 1210 provides a gain that roughly matches with a desired gain, and the fine gain adjustment stage 1220 provides a fine tuning of the gain to match with the desired gain.

In the illustrated embodiment, the coarse gain adjustment stage 1210 includes a first path 1210a and a second path 1210b. The first path 1210a can provide a gain that is greater than or equal to 1, whereas the second path 1210b provides a gain that is smaller than 1 (loss). Either the first or second path 1210a, 1210b is enabled, depending on the desired gain. The first path 1210a is used when PGA gains equal to or higher than unity (1) are used. The second path 1210b is used when PGA gains lower than unity are used. In alternative embodiments, the gain of the paths 1210a, 1210b can overlap. In other embodiments, the gain of the paths 1210a, 1210b can have different gain ranges, at least parts of which do not overlap. In an alternative embodiment, the first path 1210a can provide a gain that is greater than 1, whereas the second path 1210b provides a gain that is equal to or smaller than 1.

The first path 1210a can include a plurality of first transconductance units 1211 electrically coupled in parallel between a first node 1201 and a second node 1202. The first node 1201 can also be referred to as an input node, and the second node 1202 can also be referred to as an intermediate node in the context of this embodiment. The number of the first transconductance units 1211 can be M, where M is an integer equal to or greater than 2. Each of the first transconductance units 1211 can have an input coupled to the first node 1201, and an output coupled to the second node 1202. In one embodiment, the first transconductance units 1211 can have the same configuration as each other, that is, the units 1211 can be instantiated. In another embodiment, at least two of the first transconductance units 1211 can have different configurations from each other.

The second path 1210b includes a scale-down amplifier 1213 with a gain smaller than 1, and a plurality of second transconductance units 1212. The scale-down amplifier 1213 can have an input coupled to the first node 1201 and an output, and can have a gain of less than 1, such as, for example, ½.

The plurality of second transconductance units 1212 can be electrically coupled in parallel between the output of the scale-down amplifier 1213 and the second node 1202. Each of the second transconductance units 1212 can have an input coupled to the output of the scale-down amplifier 1213, and an output coupled to the second node 1202. The number of the second transconductance units 1212 can be the same as the number of the first transconductance units 1211, and thus can be M, where M is an integer equal to or greater than 2. In other embodiments, the number of the second transconductance units 1212 can be different from the number of the first transconductance units 1211. In one embodiment, the second transconductance units 1212 can have the same configuration as one another. In another embodiment, at least two of the second transconductance units 1212 can have different configurations from each other.

The fine gain adjustment stage 1220 can include a plurality of third transconductance units 1221 electrically coupled in parallel between the second node 1202 and a third node 1203. The third node 1203 can also be referred to as an output node in the context of this embodiment. Each of the third transconductance units 1221 can have an input coupled to the second node 1202, and an output coupled to the third node 1203. The number of the third transconductance units 1221 can be J, where J is an integer equal to or greater than 2. J can be different from M. In another embodiment, J can be the same as M. In one embodiment, the third transconductance units 1221 can have the same configuration as one another. In another embodiment, at least two of the third transconductance units 1221 can have different configurations from each other.

The PGA 1200 can also include a coarse load resistor $R_{LC}$ to aggregate and collect current outputs from the transconductance units 1211, 1212. The PGA 1200 can also include a fine load resistor $R_{LF}$ to aggregate and collect current outputs from the third transconductance units 1221.

The PGA 1200 can further include a PGA control 1250 that receives one or more gain control codes embedded in the gain control gctrl from the gain control block 820 (FIG. 8). The PGA control 1250 serves to provide one or more digital gain control signals gcr, gfn to the transconductance units 1211, 1212, 1221. The one or more digital gain control signals gcr, gfn are used to synthesize a desired overall gain of the PGA 1200 by selectively turning on or off a finite and discrete number of the transconductance units 1211, 1212, 1221.

The PGA control 1250 can decode the gain control signal gctrl from the gain control block 820 (FIG. 8) via a control bus 1253. The gain control signal gctrl can be encoded in simple binary form. The PGA control 1250 can provide first gain control signals gcr[M:1] via a first bus 1251 to the first and second transconductance units 1211, 1212, and second gain control signals gfn[J:1] via a second bus 1252 to the third transconductance units 1221. In the illustrated embodiment, the PGA control 1250 is part of the PGA 1200. In another embodiment, the PGA control 1250 can be implemented in combinational logic, and can be placed within the gain control block 820 (FIG. 8).

Each bit in the first and second buses 1251, 1252 can indicate whether a particular transconductance unit is to be enabled (on) or disabled (off). If x represents the maximum number of transconductance units that can be simultaneously enabled in the fine gain adjustment stage 1220, monotonicity of the PGA gain versus gain code curve can be obtained by making $g_{mc}$ equal to or greater than $x \cdot g_{mf} (g_{mc} \geq x \cdot g_{mf})$, where $g_{mc}$ denotes the transconductance of each of the units in the coarse gain adjustment stage 1210, and $g_{mf}$ denotes the transconductance of each of the units in the fine gain adjustment stage 1220. In one embodiment, the transconductances $g_{mc}$ and $g_{mf}$ are substantially constant for all the units.

Another term for a PGA is a variable gain amplifier (VGA). In addition, while illustrated in the context of digital control signals from the PGA control 1250, in an alternative embodiment, the digital signals from the PGA control 1250 can be provided as an input to a digital-to-analog converter, and an analog signal can be used for gain control of the PGA/VGA.

Figure 12B:
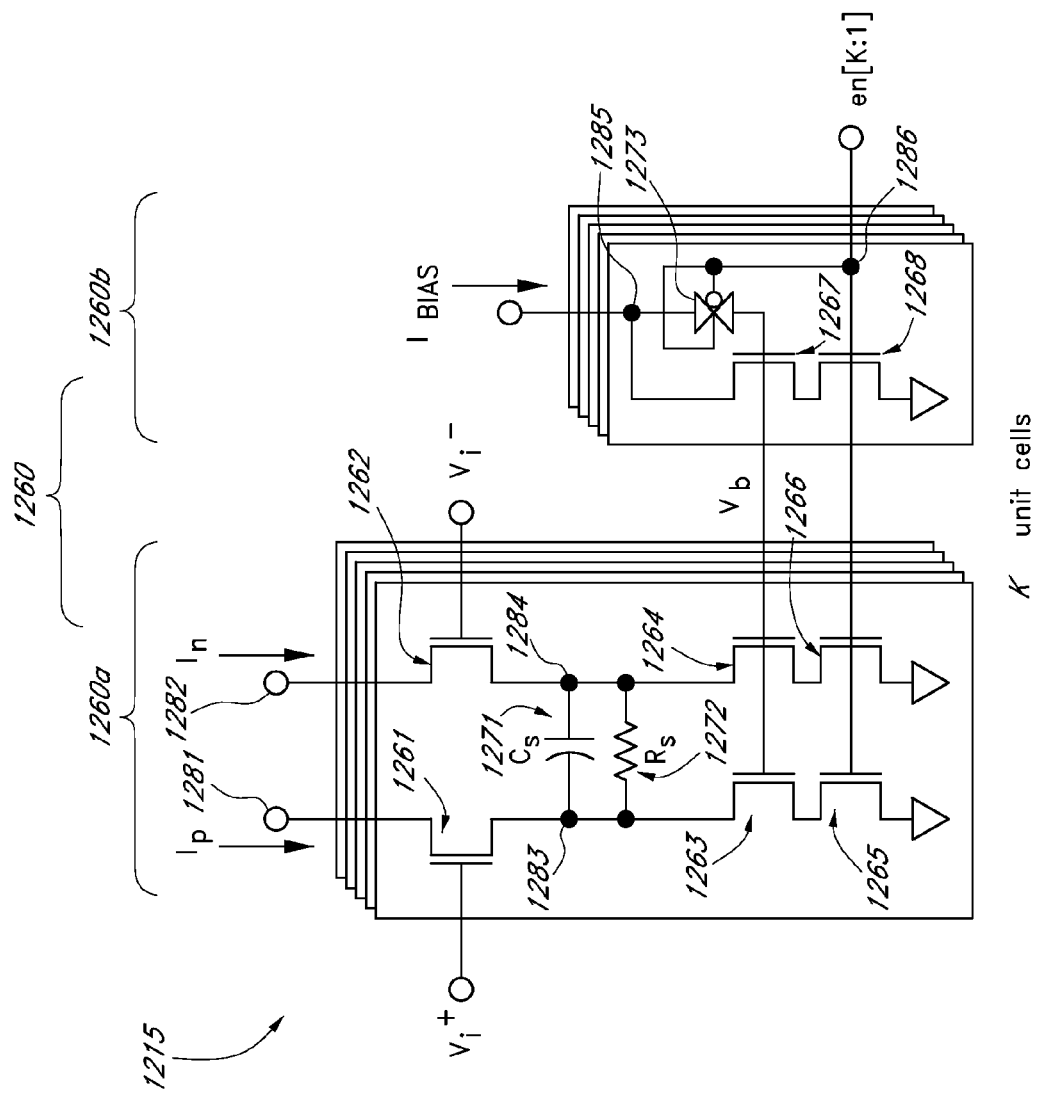
FIG. 12B is a schematic block diagram of a programmable gain amplifier stage according to one embodiment.

Referring to FIG. 12B, a voltage-mode, differential CMOS implementation of an amplification stage according to one embodiment will be described below. The illustrated amplification stage 1215 can be used to replace at least one of (1) the entirety of the plurality of the first transconductance units 1211, (2) the entirety of the plurality of the second transconductance units 1212, or (3) the entirety of the plurality of the third transconductance units 1221 (FIG. 12A).

The amplification stage 1215 can have K number of unit cells 1260, each of which includes a first portion 1260a and a second portion 1260b, where K is an integer equal to or greater than 2. For the coarse gain adjustment stage 1210 of FIG. 12A, K can be M. For the fine gain adjustment stage 1220 of FIG. 12B, K can be J.

Each of the first portions 1260a can include first to sixth transistors 1261-1266, a degeneration source capacitor 1271, a degeneration source resistor 1272, and first to fourth nodes 1281-1284. Each of the second portions 1260b can include seventh and eighth transistors 1267, 1268, a pass gate or transmission gate 1273, and fifth and sixth nodes 1285, 1286.

The first transistor 1261 can be an NMOS transistor that has a source coupled to the third node 1283, a drain coupled to the first node 1281, and a gate to receive a non-inverting component $Vi^+$ of a differential voltage input Vi. The second transistor 1262 can be an NMOS transistor that has a source coupled to the fourth node 1284, a drain coupled to the second node 1282, and a gate to receive an inverting component $Vi^-$ of the differential voltage input Vi.

The third transistor 1263 can be an NMOS transistor that has a source, a drain coupled to the third node 1283, and a gate coupled to the pass gate 1273. The fourth transistor 1264 can be an NMOS transistor that has a source, a drain coupled to the fourth node 1284, and a gate coupled to the pass gate 1273.

The fifth transistor 1265 can be an NMOS transistor that has a source coupled to a voltage reference such as ground, a drain coupled to the source of the third transistor 1263, and a gate coupled to the sixth node 1286. The sixth transistor 1266 can be an NMOS transistor that has a source coupled to the voltage reference such as ground, a drain coupled to the source of the fourth transistor 1264, and a gate coupled to the sixth node 1286.

The degeneration source capacitor 1271 can have a first terminal coupled to the third node 1283 and a second terminal coupled to the fourth node 1284. The degeneration source resistor 1272 can have a first end coupled to the third node 1283 and a second end coupled to the fourth node 1284.

The seventh transistor 1267 can be an NMOS transistor that has a source, a drain coupled to the fifth node 1285, and a gate coupled to the pass gate 1273. The eighth transistor 1268 can be an NMOS transistor that has a source coupled to the voltage reference such as ground, a drain coupled to the source of the seventh transistor 1267, and a gate coupled to the sixth node 1286. The sixth node 1286 is coupled to an enable bus en[K:1]. In other embodiments, at least one of the first to eighth transistors 1261-1268 can be replaced with a PMOS transistor or a bipolar junction transistor with a modified circuit configuration.

The pass gate 1273 can include a parallel combination of an NMOS transistor and a PMOS transistor. The pass gate 1273 can have an input coupled to the gate of the seventh transistor 1267 and an output coupled to the fifth node 1285. The NMOS transistor of the pass gate 1273 can have a gate, and the PMOS transistor of the pass gate 1273 can have a gate coupled to the gate of the NMOS transistor of the pass gate 1273. The pass gate 1273 can have an inverter driving the gate of the PMOS transistor of the pass gate 1273.

During operation, the first and second transistors 1261, 1262 form a source-degenerated differential pair that generates a differential output current $I_p - I_n$. The degeneration source resistor 1272 is used to increase the input voltage range in which the differential pair behaves approximately linearly. The degeneration source capacitor 1271 is used to increase the bandwidth of the stage, compensating mainly for parasitic load capacitors at the stage's output.

The fifth, sixth, and eighth transistors 1265, 1266, 1268 can serve as on/off "foot" switches that allow the unit cells to be enabled or disabled, depending on the state of the corresponding bit from the enable bus en[K:1]. In the illustrated embodiment, when the bit is a logic one (high), the associated unit is enabled. When the bit is a logic zero (low), the associated unit is disabled.

The third, fourth, and seventh transistors 1263, 1264, and 1267 can serve to provide a bias for the stage. The seventh transistor 1267 is diode-connected when the unit cell is enabled, and forms the input of a current mirror. The third and fourth transistors 1263, 1264 are substantially identical to each other, and form the output of the current mirror. In one embodiment, the current mirror ratio is unity. However, in alternative embodiments, the current mirror can be scaled.

Each differential pair (for example, the first and second transistors 1261, 1262, the third and fourth transistors 1263, 1264, or the fifth and sixth transistors 1265, 1266) in each of the first portions 1260a can be enabled/disabled in conjunction with its diode-connected seventh transistor 1267 in the second portion 1260b.

A bias current $I_{BIAS}$ provided to the fifth node 1285 can be evenly distributed among the enabled diode-connected transistors 1267 of the second portions 1260b, and thus the total current ($I_p$, $I_n$, and $I_{BIAS}$) of the amplification stage 1215 is $I_{stage} = 3 \cdot I_{BIAS}$ (with unity current mirror ratio). Therefore, the supply current of the amplification stage 1215 is substantially constant, regardless of the selected gain, i.e., regardless of the number of unit cells 1260 that are enabled. The bias voltage Vb is common to the first portions 1260a including differential pairs of transistors. If k denotes the number of unit cells 1260 that are enabled, the tail current of each differential pair is $I_T=(2 \cdot I_{BIAS}/k)$, which indicates that the transconductance is a function of the number of unit cells 1260 that are enabled.

In one extreme, when a relatively large number of the unit cells 1260 are enabled, the transconductance of each of the unit cells 1260 is roughly proportional to the square root of the tail current $I_T$, as expressed in Equation (3).

$$G_m(k)=g_m(k)\approx\sqrt{2 \cdot (W/L) \cdot \mu_n \cdot C_{OX} \cdot (I_{BIAS}/k)} \qquad \text{Equation (3)}$$

In Equation (3), $G_m$ is the overall differential pair transconductance, $g_m$ is the transistor transconductance, W is the width of a transistor channel, L is the length of the transistor channel, $\mu_n$ is electron mobility and $C_{OX}$ is the gate capacitance density. Therefore, at this extreme, the overall stage transconductance can have a dependency on a term expressed in Equation (4) below.

$$k \cdot \sqrt{(I_{BIAS}/k)}=\sqrt{k \cdot I_{BIAS}} \qquad \text{Equation (4)}$$

At the other extreme, when a relatively small number of unit cells 1260 are enabled, the product $g_m \cdot Rs$ is substantially greater than 1 ($g_m \cdot Rs \gg 1$). Thus, the equivalent transconductance of the unit cell can be expressed in Equation (5) below.

$$G_m(k) \approx 1/(1+(g_m+g_{mb}) \cdot R_S) \approx 1/R_S \qquad \text{Equation (5)}$$

In Equation (5), variable $g_{mb}$ is the back-gate transconductance of one of the differential pair transistors, assuming that all the transistors are placed in the same substrate or well. If each transistor has its own well, then $g_{mb}$ is 0. Therefore, at this extreme, the overall stage transconductance can depend roughly on $k/R_s$.

It follows that to make the amplification stage transconductance $G_m(k)$ linear as a function of the gain code, the number of unit cells added per gain code increment should be increased as the gain code increases. For example, for gain codes 2, 3, 4, 5, . . . 13, 14, or 15, the number of unit cells enabled could be 2, 3, 4, 6, . . . , 18, 25, or 35 so that the number of unit cells added per step are 1, 1, 2, . . . , 7, or 10. The actual number of unit cells added per gain code step can depend on the specifics of the implementation of the unit cells such as fabrication process used, target power dissipation, silicon area, and the like.

The above-described PGA architecture can have the following main advantages. A two-stage amplification path for gains higher than unity or around unity can increase the speed of the system. For a given power dissipation, an exponentially increasing number of cells is needed to implement a large gain since the total transconductance has a square root dependence on the number of unit cells (individual differential pairs) when several unit stages are enabled. The input node of a single-stage amplification system would therefore have a much larger capacitive load than any single node in a two-stage amplification system.

In the embodiment of FIG. 12A, dedicated paths for relatively low gain (loss) and relatively high gain can improve the linearity of both paths since each has a smaller input range. Additionally, a dedicated path for a gain lower than unity allows for handling of large input signal amplitudes which are typically present in specialized scenarios such as compliance testing. For example, for a typical 0.18 μm process, $V_{DD}$ can be about 1.8 V and the maximum HDMI single-ended amplitude can be about 600 mV, or 33% of the available head-room.

Figure 13:
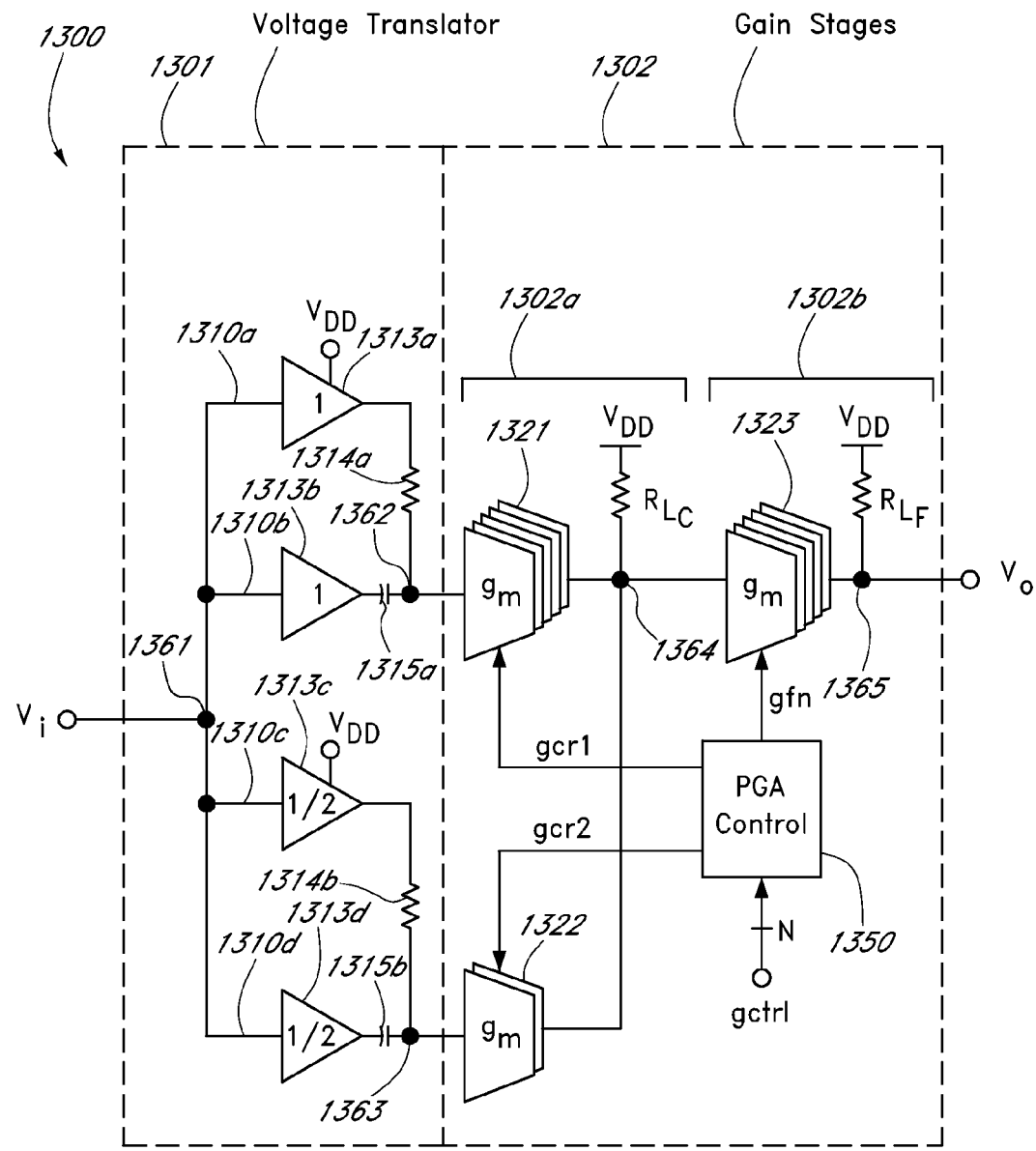
FIG. 13 is a schematic block diagram of a programmable gain amplifier block according to another embodiment.

Referring to FIG. 13, a programmable gain amplifier (PGA) according to another embodiment will be described below. The illustrated PGA 1300 can be used for the PGA 810 of FIG. 8. The PGA 1300 can include a voltage translator 1301 and a gain stage 1302.

The voltage translator 1301 can include first to fourth paths 1310a-1310d. The first path 1310a can include a first unity-gain amplifier 1313a and a first resistor 1314a coupled in series between a first node 1361 and a second node 1362. The second path 1310b can include a second unity-gain amplifier 1313b and a first capacitor 1315a coupled in series between the first node 1361 and the second node 1362. The third path 1310c can include a first scale-down amplifier 1313c and a second resistor 1314b coupled in series between the first node 1361 and a third node 1363. The fourth path 1310d can include a second scale-down amplifier 1313d and a second capacitor 1315b coupled in series between the first node 1361 and the third node 1363. The first and second scale-down amplifier 1313c, 1313d can have a gain lower than 1, for example, ½. Other applicable gain (loss) values will be readily determined by one of ordinary skill in the art.

The first path 1310a and the second path 1310b can be used when the gain of the PGA 1300 needs to be equal to or greater than 1. The first path 1310a can be used when the input signal has a relatively low frequency, for example, about 0 Hz to about 10 MHz. The first path 1310a has a low pass filter formed by the first resistor 1314a and the first capacitor 1315a at its output. The second path 1310b can be used when the input signal has a relatively high frequency, for example, about 10 MHz to about 10 GHz. The upper limit of the frequency range of the second path 1310b can be determined by parasitic components of the circuit. The second path 1310b has a high pass filter formed by the first resistor 1314a and the first capacitor 1315a at its output.

The third path 1310c and the fourth path 1310d can be used when the gain of the PGA 1300 needs to be lower than 1. The third path 1310c can be used when the input signal has a relatively low frequency, for example, about 0 Hz to about 10 MHz. The third path 1310c has a low pass filter formed by the second resistor 1314b and the second capacitor 1315b at its output. The fourth path 1310d can be used when the input signal has a relatively high frequency, for example, about 10 MHz to about 10 GHz. The upper limit of the frequency range of the fourth path 1310d can be determined by parasitic components of the circuit. The fourth path 1310d has a high pass filter formed by the second resistor 1314b and the second capacitor 1315b at its output. In alternative embodiments, the first path and second path 1310a, 1310b can be used when the gain of the PGA 1300 needs to be greater than 1 whereas the third path 1310c and the fourth path 1310d can be used when the gain of the PGA 1300 needs to be equal to or lower than 1.

The gain stage 1302 can include a coarse gain adjustment stage 1302a and a fine gain adjustment stage 1302b cascaded with each other. In the illustrated embodiment, the coarse gain adjustment stage 1302a includes a plurality of first transconductance units 1321 electrically coupled in parallel between the second node 1362 and a fourth node 1364, and a plurality of second transconductance units 1322 electrically coupled in parallel between the third node 1363 and the fourth node 1364. The number of the second transconductance units 1322 can be different from the number of the first transconductance units 1321. In other embodiments, the number of the second transconductance units 1322 can be the same as the number of the first transconductance units 1321. The fine gain adjustment stage 1302b can include a plurality of third transconductance units 1323 electrically coupled in parallel between the fourth node 1364 and a fifth node 1365.

The PGA 1300 can also include a coarse load resistor $R_{LC}$ to aggregate and collect current outputs from the transconductance units 1321, 1322. The PGA 1300 can also include a fine load resistor $R_{LF}$ to aggregate and collect current outputs from the third transconductance units 1323.

The PGA 1300 can further include a PGA control 1350 that receives a gain control signal gctrl from the gain control block 820 (FIG. 8). The PGA control 1350 serves to provide digital gain control signals to synthesize a desired gain of the PGA 1300 by selectively turn on or off a finite and discrete number of the transconductance units 1321, 1322, 1323. The PGA control 1350 can provide separate control signals gcr1, gcr2, gfn to the first to third transconductance units 1321, 1322, 1323, respectively. Other details of the gain stage 1302 can be as described above in connection with FIGS. 12A and 12B.

Method of Adapting Programmable Gain Amplifier

Figures 14A, 14B:
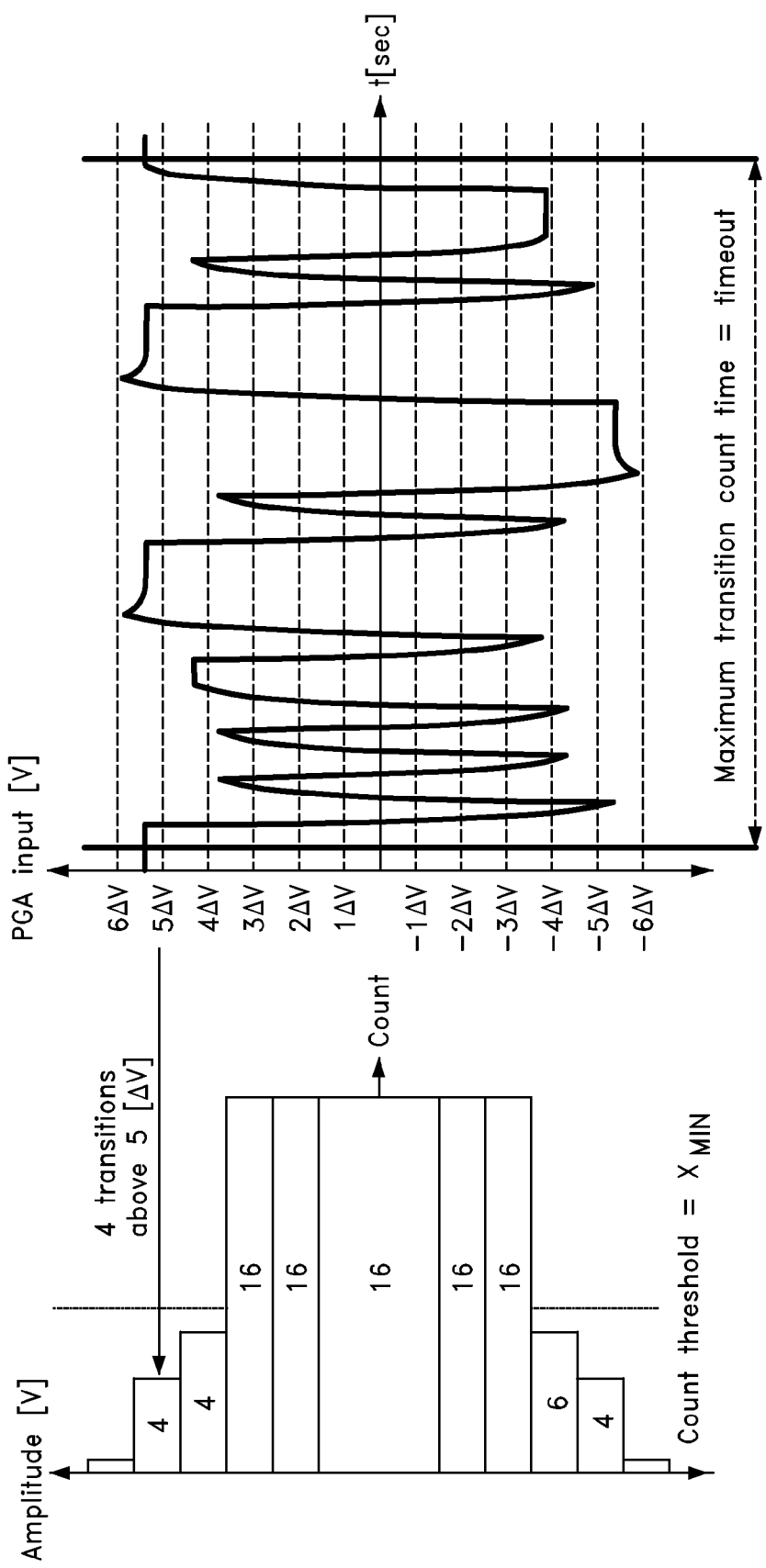
FIG. 14A is a schematic histogram showing an amplitude envelope in a programmable gain amplifier according to one embodiment.
FIG. 14B is a timing diagram showing an input voltage signal of a programmable gain amplifier according to one embodiment.

In one embodiment, the gain of a programmable gain amplifier can be adapted, based at least partly on the observation of a PGA input amplitude envelope. For example, for any non-zero PGA input amplitude envelope, sweeping a window comparator (FIG. 9) threshold voltage from zero to its maximum and counting the transitions of the window comparator output for a fixed period of time ($T_{INT}$) can create an amplitude envelope histogram from which the PGA input amplitude can be estimated. For example, FIG. 14A shows a histogram generated from the graph of FIG. 14B. For example, the histogram of FIG. 14A indicates that there are four transitions above 5ΔV within a selected period of time in the graph of FIG. 14B. With this estimation, the PGA gain can be set to obtain the desired PGA output amplitude.

Figure 15:
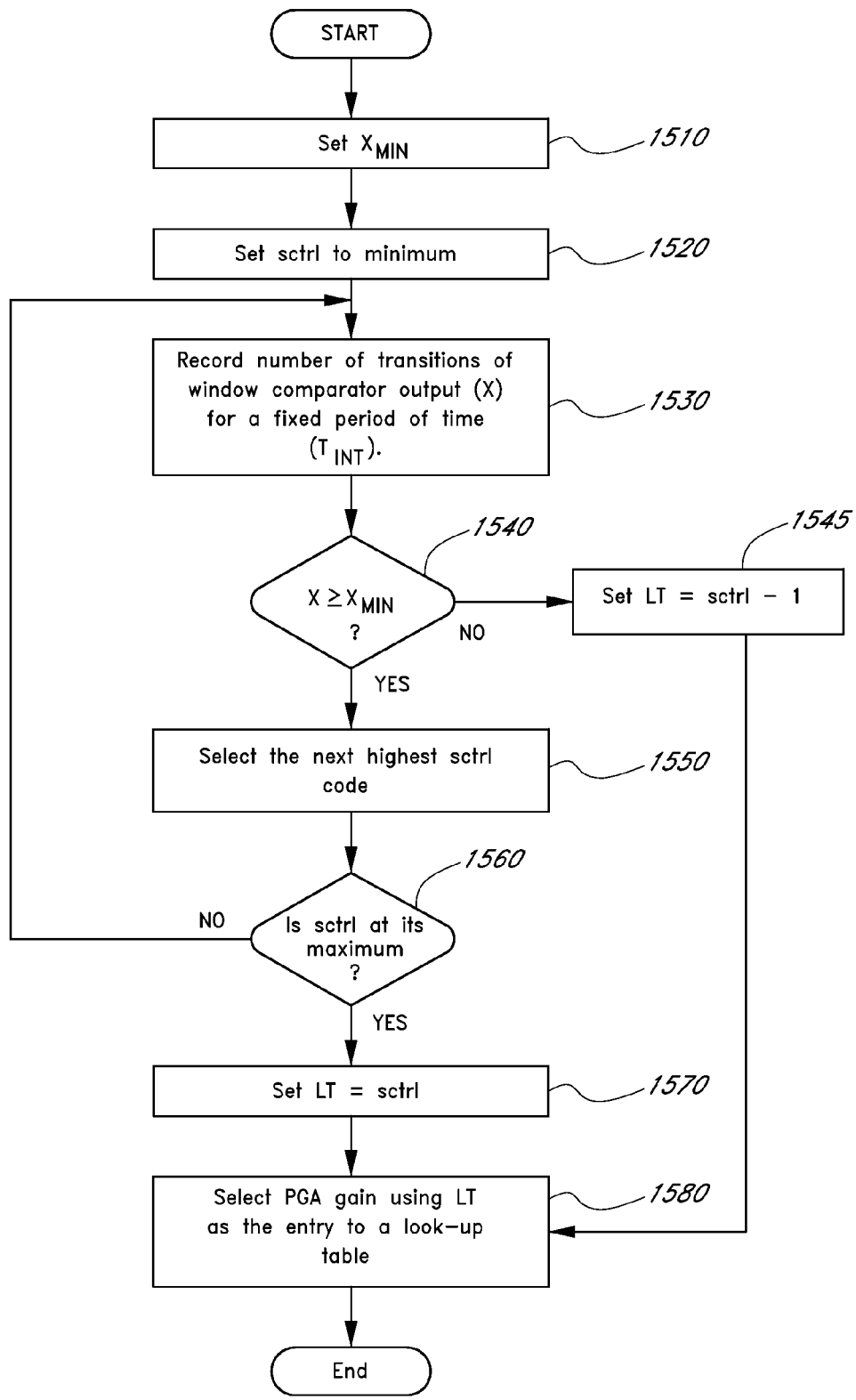
FIG. 15 is a flowchart illustrating a method of adapting the gain of a programmable gain amplifier according to one embodiment.

Referring to FIG. 15, a method of adapting the gain of a PGA 810 (FIG. 8) according to one embodiment will be described below. In FIG. 15, one or more additional blocks can be added. In addition, one or more of the blocks 1510-1580 can be omitted or rearranged. In one embodiment, the method can be implemented by the PGA block 800 including the PGA 810 and the gain control block 820 described in connection with FIGS. 8 and 9. Initially, the PGA 810 is set to have a minimum gain, and the gain control block 820 is also set to provide a control signal indicating the minimum gain to the PGA 810.

Referring back to FIG. 15, at block 1510, $X_{MIN}$ is set. $X_{MIN}$ is the minimum number of transitions of window comparator output needed for the window comparator programmable threshold to be lower than the PGA input amplitude envelope. In an ideal system, $X_{MIN}$ is 1 ($X_{MIN}$=1), but noise, crosstalk and other factors may force this minimum number to be higher than unity. An applicable value for $X_{MIN}$ will be readily determined by those of ordinary skill in the art.

At block 1520, level shift control sctrl (see FIGS. 9 and 11A) is set to minimum (typically zero). At block 1530, the number of transitions of window comparator output (X) is recorded for a fixed period of time ($T_{INT}$). The length of the fixed period depends on the data coding, and it should be long enough so that there is high probability that the longest run lengths are included, as these set the PGA input amplitude envelope.

At block 1540, if X is equal to or greater than $X_{MIN}$, the method proceeds to block 1550. Otherwise, a look-up table entry number (LT) is set to be sctrl−1 at block 1545, and the method proceeds to block 1580. The term "look-up table entry number (LT)" can also be referred to as an index to a look-up table in the context of this document. The step performed at the block 1540 can be referred to as a voltage level shifter step, and can be the minimum step by which a voltage level shifter (for example, the voltage level shifter 1100 of FIG. 11A) can shift the input signal.

At block 1550, the next highest sctrl code is selected according to a particular increment procedure. At block 1560, if sctrl is at its maximum level, the variable LT is set to be sctrl at block 1570. Otherwise, the method proceeds to the block 1530. At block 1580, PGA gain is selected using the variable LT as the entry to a look-up table.

In one embodiment, the look-up table can be constructed with the following pieces of information, for example, window comparator programmable voltage shifter step (LSB generated by the voltage level shifter which is part of the window comparator), available PGA gain settings and gain associated with them, and desired PGA output amplitude. For example, assume that the full swing of the window comparator level shifter is $V_{FS}$=813.44 mV, and the window comparator has a 6-bit DAC. In this case, the voltage level shifter step ($V_{LSB}$) can be $V_{LSB}$=813.38 mV/$2^6$≈12.71 mV. Additionally, assume that the desired PGA output amplitude is $V_{OUT}$=500 mV, and that the available PGA gain control or gain setting gctrl and its associated gain ($A_{PGA}$ (gctrl)) are as listed in Table 2.

TABLE 2

| PGA gain setting [gctrl] | PGA gain [$A_{PGA}$] |
|---|---|
| 0 | 0.500 |
| 1 | 0.625 |
| 2 | 0.750 |
| 3 | 0.875 |
| 4 | 1.000 |
| 5 | 1.250 |
| 6 | 1.500 |
| 7 | 1.750 |
| 8 | 2.000 |
| 9 | 2.500 |
| 10 | 3.000 |

Then, the input PGA amplitude envelope can be estimated as expressed in Equation (6).

$$A_{IN} \approx LT \cdot V_{LSB} \qquad \text{Equation (6)}$$

In addition, the PGA gain that should be used (with no regard to quantization) can be expressed as in Equation (7).

$$A_V = \frac{V_{OUT}}{V_{IN}} = \frac{V_{OUT}}{LT \cdot V_{LSB}} \qquad \text{Equation (7)}$$

The corresponding PGA gain setting can be as expressed in Equation (8).

$$\text{gctrl}[i]: A_{PGA}(\text{gctrl}[i-1]) \geq A_V \geq A_{PGA}(\text{gctrl}[i]) \qquad \text{Equation (8)}$$

The resulting look-up table showing a relationship between the gain setting gctrl and the variable LT is shown in FIG. 16 and in Table 3 below. If the estimation procedure determines that LT=20, $A_v$=500 mV/(20·12.71 mV)≈1.967. From Table 2, 1.967 is between gctrl=7 and gctrl=8 and thus the gain setting can be chosen to be gctrl=7.

TABLE 3

| LT | $A_v$ | $A_{PGA}$ | Gain setting |
|---|---|---|---|
| 0 | ∞ | 3.500 | 10 |
| 1 | 39.3410 | 3.500 | |
| 2 | 19.6705 | 3.500 | |
| 3 | 13.1137 | 3.500 | |
| 4 | 9.8353 | 3.500 | |
| 5 | 7.8682 | 3.500 | |
| 6 | 6.5568 | 3.500 | |
| 7 | 5.6201 | 3.500 | |
| 8 | 4.9176 | 3.500 | |
| 9 | 4.3712 | 3.500 | |
| 10 | 3.9341 | 3.500 | |

TABLE 3-continued

| LT | $A_v$ | $A_{PGA}$ | Gain setting |
|---|---|---|---|
| 11 | 3.5765 | 3.500 | |
| 12 | 3.2784 | 3.500 | |
| 13 | 3.0262 | 3.000 | 9 |
| 14 | 2.8101 | 3.000 | |
| 15 | 2.6227 | 2.500 | 8 |
| 16 | 2.4588 | 2.500 | |
| 17 | 2.3142 | 2.500 | |
| 18 | 2.1856 | 2.000 | 7 |
| 19 | 2.0706 | 2.000 | |
| 20 | 1.9671 | 2.000 | |
| 21 | 1.8734 | 1.750 | 6 |
| 22 | 1.7882 | 1.750 | |
| 23 | 1.7105 | 1.750 | |
| 24 | 1.6392 | 1.750 | |
| 25 | 1.5736 | 1.500 | 5 |
| 26 | 1.5131 | 1.500 | |
| 27 | 1.4571 | 1.500 | |
| 28 | 1.4050 | 1.500 | |
| 29 | 1.3566 | 1.250 | 4 |
| 30 | 1.3114 | 1.250 | |
| 31 | 1.2691 | 1.250 | |
| 32 | 1.2294 | 1.250 | |
| 33 | 1.1922 | 1.250 | |
| 34 | 1.1571 | 1.250 | |
| 35 | 1.1240 | 1.000 | 3 |
| 36 | 1.0928 | 1.000 | |
| 37 | 1.0633 | 1.000 | |
| 38 | 1.0353 | 1.000 | |
| 39 | 1.0087 | 1.000 | |
| 40 | 0.9835 | 1.000 | |
| 41 | 0.9595 | 1.000 | |
| 42 | 0.9367 | 0.875 | 2 |
| 43 | 0.9149 | 0.875 | |
| 44 | 0.8941 | 0.875 | |
| 45 | 0.8742 | 0.875 | |
| 46 | 0.8552 | 0.875 | |
| 47 | 0.8370 | 0.875 | |
| 48 | 0.8196 | 0.875 | |
| 49 | 0.8029 | 0.750 | 1 |
| 50 | 0.7868 | 0.750 | |
| 51 | 0.7714 | 0.750 | |
| 52 | 0.7566 | 0.750 | |
| 53 | 0.7423 | 0.750 | |
| 54 | 0.7285 | 0.750 | |
| 55 | 0.7153 | 0.750 | |
| 56 | 0.7025 | 0.750 | |
| 57 | 0.6902 | 0.750 | |
| 58 | 0.6783 | 0.625 | 0 |
| 59 | 0.6668 | 0.625 | |
| 60 | 0.6557 | 0.625 | |
| 61 | 0.6449 | 0.625 | |
| 62 | 0.6345 | 0.625 | |
| 63 | 0.6245 | 0.625 | |

There are at least two methods to increase the voltage level shift control sctrl and obtain a value for the lookup table entry number LT. One is simply an exhaustive space search, in other words, increasing sctrl by 1 LSB, from 0 to 63. However, because the PGA gain can be quantized, several values for the variable LT can map to the same gain control, gctrl. Therefore, one method that can yield a shorter adaptation time is to search only the sctrl codes that would produce a different value for the gain control gctrl. In the example of Table 3, the value for the level shift control sctrl would be 12, 14, 17, 20, 24, 28, 34, 41, 48 and 57; a difference of 53 codes with respect to the exhaustive search case, or in this example a reduction of the adaptation time of $(64-10) \cdot T_{INT} = 53 \cdot T_{INT}$.

Applications

In the embodiments described above, data transmission systems employing the above described configurations can be implemented into various electronic devices or integrated circuits. Examples of the electronic devices can include, but are not limited to, consumer electronic products, parts of the consumer electronic products, electronic test equipments, etc. Examples of the electronic devices can also include memory chips, memory modules, circuits of optical networks or other communication networks, and disk driver circuits. The consumer electronic products can include, but are not limited to, a mobile phone, a smart phone, cellular base stations, a telephone, a television, a computer monitor, a computer, a hand-held computer, a tablet computer, a personal digital assistant (PDA), a stereo system, a cassette recorder or player, a set-top box, a satellite television receiver, a cable television receiver, an Internet video streaming receiver box, a portable media player, a video game console, a DVD player, a CD player, a VCR, an MP3 player, a radio, a camcorder, a camera, a digital video recorder, a digital camera, a portable memory chip, a copier, a facsimile machine, a scanner, a multi functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A method of electronic amplification, the method comprising:
    receiving an input signal at an input of a receiver over a channel;
    obtaining information on an amplitude envelope of the input signal for a selected period of time;
    digitally adjusting a gain of a programmable gain amplifier (PGA) of the receiver based at least partly on the information, wherein the PGA comprises a plurality of transconductance units, wherein digitally adjusting the gain of the PGA comprises selectively turning on a discrete number of the transconductance units of the PGA; and
    amplifying the input signal using the PGA with the adjusted gain,
    wherein obtaining the information on the amplitude envelope comprises adjusting a limit of a window comparator to determine the amplitude envelope of the input signal.

2. A method of electronic amplification, the method comprising:
    receiving an input signal at an input of a receiver over a channel;
    obtaining information on an amplitude envelope of the input signal for a selected period of time;
    adjusting a gain of a programmable gain amplifier (PGA) of the receiver based at least partly on the information; and
    amplifying the input signal using the PGA with the adjusted gain,
    wherein obtaining the information on the amplitude envelope comprises adjusting a limit of a window comparator to determine the amplitude envelope of the input signal,
    wherein obtaining the information on the amplitude envelope further comprises using a look-up table to generate a gain control signal of the PGA based on the determined amplitude envelope.

3. The method of claim 1, wherein adjusting the limit of the window comparator comprises:
adjusting one or more level shift voltages to change the size of the window of the window comparator; and
observing one or more transitions of the window comparator in a time interval to determine the amplitude envelope.

4. The method of claim 3, wherein obtaining the information on the amplitude envelope further comprises:
setting a count threshold for transitions of the window comparator in the time interval to a first minimum value;
setting a level shift control to a second minimum value;
recording the number of transitions of the window comparator; and
determining if the number of transitions exceeds the first minimum value.

5. The method of claim 4, wherein obtaining the information on the amplitude envelope comprises:
when the number of transitions is equal to or greater than the first minimum value, increasing the level shift control to a next highest value and setting a look-up table value to the next highest value; and
when the number of transitions is less than the first minimum value, decreasing the level shift control to a next lowest value and setting the look-up table value to the next lowest value; and
selecting the gain of the PGA using the look-up table value.

6. The method of claim 1, wherein amplifying the input signal using the PGA comprises generating an output signal with a substantially constant amplitude envelope.

7. The method of claim 6, further comprising filtering the output signal of the PGA using a filter.

8. The method of claim 1, further comprising dividing an output of the window comparator using a frequency divider to generate a divider output signal.

9. The method of claim 8, further comprising processing the divider output signal using a digital gain controller to generate a digital gain control signal of the PGA.

10. The method of claim 1, wherein digitally adjusting the gain of the PGA comprises digitally controlling a gain of a coarse adjustment stage of the PGA and digitally controlling a gain of a fine adjustment stage of the PGA.

11. The method of claim 10, wherein amplifying the input signal using the PGA with the adjusted gain comprises translating a voltage of the input signal to generate a translated voltage, and amplifying the translated voltage using the coarse adjustment stage and the fine adjustment stage.

12. A method of electronic amplification, the method comprising:
receiving an input signal at an input of a receiver over a channel;
obtaining information on an amplitude envelope of the input signal for a period of time;
adjusting a gain of a programmable gain amplifier (PGA) of the receiver based at least partly on the information, wherein the PGA comprises a coarse gain adjustment stage and a fine gain adjustment stage in a cascade, and wherein adjusting the gain of the PGA comprises digitally controlling a gain of the coarse adjustment stage and a gain of the fine adjustment stage; and
amplifying the input signal using the PGA with the adjusted gain.

13. The method of claim 12, wherein digitally controlling the gain of the coarse adjustment stage and the fine adjustment stage comprises:
controlling the gain of the PGA in increments of a first step size using the coarse adjustment stage; and
controlling the gain of the PGA in increments of a second step size using the fine adjustment stage,
wherein the first step size is larger than the second step size.

14. The method of claim 12, wherein the coarse adjustment stage comprises a first gain path comprising a first plurality of transconductance units electrically coupled in parallel, and wherein adjusting the gain of the PGA comprises turning on a number of the first plurality of transconductance units to provide gain.

15. The method of claim 14, wherein the coarse gain adjustment stage further comprises a second gain path comprising a scale-down amplifier and a second plurality of transconductance units, wherein the second plurality of transconductance units are electrically coupled in parallel, and wherein adjusting the gain of the PGA further comprises turning on a number of the second plurality of transconductance units to provide gain.

16. The method of claim 15, wherein the fine gain adjustment stage comprises a third plurality of transconductance units electrically coupled in parallel, wherein adjusting the gain of the PGA further comprises turning on a number of the third plurality of transconductance units to provide gain.

17. The method of claim 12, wherein digitally controlling the gain of the coarse adjustment stage comprises amplifying the input signal using two gain paths that have different gain ranges that are at least partially non-overlapping.

18. The method of claim 17, wherein digitally controlling the gain of the coarse adjustment stage further comprises amplifying the input signal using a first gain path having a gain greater than or equal to 1 and amplifying the input signal using a second gain path having a gain smaller than 1.

19. The method of claim 12, wherein amplifying the input signal using the PGA comprises generating an output signal with a substantially constant amplitude envelope.

20. The method of claim 19, further comprising filtering the output signal of the PGA using a filter.

* * * * *

UNITED STATES PATENT AND TRADEMARK OFFICE
CERTIFICATE OF CORRECTION

PATENT NO. : 9,099,976 B2
APPLICATION NO. : 14/047293
DATED : August 4, 2015
INVENTOR(S) : Pablo Acosta-Serafini It is certified that error appears in the above-identified patent and that said Letters Patent is hereby corrected as shown below:

Specification

In column 6 at line 51, Change "(CIVIL)." to --(CML).--.

In column 6 at line 61, Change "(CIVIL)" to --(CML)--.

In column 7 at line 39, Change "51" to --S1--.

In column 7 at line 42, Change "51" to --S1--.

In column 7 at line 43, Change "51" to --S1--.

In column 7 at line 51, Change "51" to --S1--.

In column 7 at line 52, Change "51." to --S1.--.

In column 7 at line 60, Change "51" to --S1--.

In column 9 at line 10, Change "$V_S^+$-$V_S^-$" to --$V_R^+$-$V_R^-$--.

In column 16 at line 46, Change "(gcrtl[i-1])" to --(gctrl[i-1])--.

In column 16 at line 46, Change "(gcrtl[i])" to --(gctrl[i])--.

In column 16 at line 50, Change "$A_v$" to --$A_V$--.

Signed and Sealed this
Fifteenth Day of March, 2016

Michelle K. Lee
*Director of the United States Patent and Trademark Office*